(12) United States Patent
Kitabatake

(10) Patent No.: US 6,214,107 B1
(45) Date of Patent: Apr. 10, 2001

(54) METHOD FOR MANUFACTURING A SIC DEVICE

(75) Inventor: Makoto Kitabatake, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 08/993,817

(22) Filed: Dec. 18, 1997

Related U.S. Application Data

(63) Continuation of application No. PCT/JP97/00855, filed on Oct. 23, 1997.

(30) Foreign Application Priority Data

| Apr. 18, 1996 | (JP) | 8-096496 |
| Apr. 19, 1996 | (JP) | 8-098218 |
| Apr. 19, 1996 | (JP) | 8-098219 |
| Nov. 15, 1996 | (JP) | 8-304383 |

(51) Int. Cl.$^7$ ................................................. C30B 25/02
(52) U.S. Cl. .............................. 117/95; 117/97; 438/268; 438/273; 438/285
(58) Field of Search .................. 117/95, 97; 438/268, 438/273, 285

(56) References Cited

U.S. PATENT DOCUMENTS

| 4,966,860 | * 10/1990 | Suzuki et al. |
| 5,563,428 | 10/1996 | EK et al. |
| 5,936,807 | * 10/1999 | Ueno ................... 438/268 |

FOREIGN PATENT DOCUMENTS

| 60-136223 | 7/1985 | (JP) . |
| 62-33422 | 2/1987 | (JP) . |
| 63-139096 | 6/1988 | (JP) . |
| 2-177534 | 7/1990 | (JP) . |
| 2-180796 | 7/1990 | (JP) . |
| 3-127829 | 5/1991 | (JP) . |
| 7-131067 | 5/1995 | (JP) . |
| 7-172997 | 7/1995 | (JP) . |
| 7-240409 | 9/1995 | (JP) . |

OTHER PUBLICATIONS

May 1991 Robert F. Davis et al., "Thin Film Deposition and Microelectronic and Optoelectronic Device Fabrication and Characterization in Monocrystalline Alpha and Beta Silicon Carbide", *Proceedings of the IEEE*, vol. 79, No. 5, pp. 677–700.

1989 Robert F. Davis, "Epitaxial Growth and Doping of and Device Development in Monocrystalline β–SiC Semiconductor Thin Films", *Thin Solid Films*, 181, pp. 1–5.

Oct. 1993 Makoto Kitabatake et al., "Simulations and experiments of SiC heteroepitaxial growth on Si(001) surface", *Journal of Applied Physics*, vol. 74, No. 7, pp. 4438–4445.

* cited by examiner

*Primary Examiner*—Felisa Hiteshew
(74) *Attorney, Agent, or Firm*—Merchant & Gould P.C.

(57) ABSTRACT

A method for manufacturing a device of silicon carbide (SiC) and a single crystal thin film, which are wide band gap semiconductor materials and can be applied to semiconductor devices such as high power devices, high temperature devices, and environmentally resistant devices, is provided by heating a silicon carbide crystal in an oxygen atmosphere to form a silicon (di)oxide thin film on a silicon carbide crystal surface, and etching the silicon (di)oxide thin film formed on the silicon carbide crystal surface to prepare a clean SiC surface. The above SiC device comprises a clean surface having patterned steps and terraces, has a surface defect density of $10^8$ cm$^{-2}$ or less, or has at least a layered structure in which an n-type silicon carbide crystal is formed on an n-type Si substrate surface.

46 Claims, 15 Drawing Sheets

300nm

METHOD FOR MANUFACTURING A SIC DEVICE

This Application is a continuation of PCT/JP97/00855 filed on Oct. 23, 1997.

TECHNICAL FIELD

The present invention relates to a method for manufacturing a single crystal thin film of silicon carbide (SiC) that is a wide band gap semiconductor material and can be applied to semiconductor devices such as high power devices, high temperature devices, and environmentally resistant devices. More particularly, the present invention relates to a method for forming a single-phase 3C—SiC single crystal thin film having a few crystal defects by heteroepitaxial growth on the Si wafer substrate surface.

The method for treating the surface of SiC according to the present invention relates to a method for forming an insulating film and a method for forming a clean surface in forming an electronic device such as a semiconductor device or a sensor using silicon carbide (SiC), a method for forming a surface structure having a trench structure or the like, and a SiC device having the formed low defect surface.

The SiC device of the present invention can be used for a semiconductor electronic device such as a power device or a sensor using SiC formed on a Si substrate or 6H(4H)—SiC wafers.

BACKGROUND

In order to form a silicon carbide semiconductor device with good reproducibility, it is required that a SiC clean surface is formed first and then an insulating film, an electrode, or the like is formed on the clean surface. Therefore, the structure of the SiC clean surface and a method for forming the SiC clean surface must be established. However, this method has not been reported. It is known that when SiC is heated to a very high temperature of 1300° C. or higher under high vacuum, Si desorbs from the surface and the surface is covered with excessive carbon. The carbon has been turned into graphite, and if junction interface formation or epitaxial growth is carried out using this surface, an impurity level is formed at the interface. Also, the temperature of 1300° C. is too high and is a problem from the viewpoint of the processing. Therefore, an improvement in the method for forming a clean surface at low temperature has been required.

Also, in order to form a more efficient electronic device, it is sometimes required to form structural patterns of steps and terraces such as a trench structure on the SiC surface. However, a method for forming the trench structure or the like into the SiC surface, with good reproducibility, good control, and low defect, has not been established. A surface having structural patterns, formed by reactive ion etching with a HCl gas or an $O_2+CF_4$ gas, ion milling with an inert gas, HF plasma etching, laser etching using excimer lasers, or mechanical cutting or grinding with a diamond saw, has defects of about $10^9$ cm$^{-2}$ or more, causing a problem when forming electronic devices.

Conventionally, 6H-type and 4H-type SiC single crystal substrates (wafers) have been commercially available. On the other hand, 3C—SiC, which has the highest drift speed, can only be formed as a heteroepitaxially grown crystal on the Si substrate. When growing silicon carbide (3C—SiC) on the Si substrate surface, carbon and/or hydrogen gases are first supplied to the Si surface to be carbonized by heating, and then carbon and silicon are supplied to heteroepitaxially grow silicon carbide. In the silicon carbide thin film formed by this conventional technique, the formation of high density lattice defects, twins, pits, or the like occurs at the SiC/Si interface, causing a problem when the silicon carbide is applied to forming an electronic device. Furthermore, single crystal grains with two types of phases grow on the Si substrate, and an anti phase boundary (APB) is formed at the interface of the two types of the crystal grains having a different phase from each other, so that a number of defects are introduced.

Conventionally, an insulating film for electronic devices comprises a silicon (di)oxide thin film formed by subjecting SiC itself to an oxidation treatment. For example, by subjecting a 6H—SiC(0001)Si face to wet oxidation at 1100° C. for 1 hour, a thin silicon (di)oxide thin film having a thickness of about 30 nm (300 angstroms) is formed. However, the oxidation speed of 30 nm (300 angstroms)/hour is much lower than 700 nm (7000 angstroms)/hour for a normal Si process and is not practical. Also, the silicon (di)oxide $SiO_2$ is formed by oxidizing silicon carbide containing Si atoms and C atoms in a ratio of 1:1, so that the silicon (di)oxide contains surplus carbon atoms and has a low electrical insulating property. Furthermore, when measuring the refractive index and the thickness using an ellipsometer, the refractive index is about 1.2 to 1.3, smaller than 1.4 to 1.5 for intrinsic silicon (di)oxide. This shows that the silicon (di)oxide contains a portion different from the intrinsic $SiO_2$ or that the $SiO_2$/SiC interface is not abrupt and contains other substances, causing a problem when it is used as the insulating film for an electronic device that requires a clean interface.

With respect to single crystal substrates such as 6H and 4H of SiC, the silicon carbide crystals are very hard. Therefore, it has been known conventionally that when a single crystal is cut and polished during the processing for wafers, a number of defects are introduced especially to the surface. In the surface treatment for these substrates, cleaning with an agent such as RCA cleaning has conventionally been carried out. However, the defects present near the silicon carbide surface cannot be removed by cleaning with an agent such as the conventional RCA cleaning. Therefore, when an electronic device is formed, the mobility, the reproducibility, the breakdown voltage and the like degrade.

The single-crystal silicon-carbide wafer size is about a diameter of 30 mm, which is too small, which is a problem from a practical viewpoint. Therefore, SiC formed on the Si substrate surface is expected as a wafer having a large area. However, the electric characteristics of the SiC/Si layered structure are not clear. Therefore, a vertical type semiconductor device in which current flows through the SiC/Si interface has not been implemented, for example; the loss caused by the forward voltage drop, or the like cannot be determined.

SUMMARY OF THE INVENTION

It is an object of the present invention to provide a method for manufacturing a single crystal thin film of silicon carbide (SiC) that is a wide band gap semiconductor material and can be applied to semiconductor devices such as high power devices, high temperature devices, and environmentally resistant devices. More particularly, it is a first object of the present invention to provide a method for forming an insulating film, a method for forming a clean surface for application of an electronic device such as a semiconductor device or a sensor using silicon carbide (SiC), a method for forming a surface structure having a trench structure or the like, and a SiC device having the formed low defect surface.

Next, it is a second object to provide a method for forming a single-phase 3C—SiC single crystal thin film having few crystal defects by heteroepitaxial growth on the Si wafer substrate surface.

Furthermore, it is a third object of the present invention to provide a semiconductor electronic device such as a power device or a sensor using SiC formed on a Si substrate.

In order to achieve the above first objects, a method for manufacturing a SiC device according to the present invention comprises a process for forming a silicon (di)oxide thin film on a silicon carbide crystal surface by heating a silicon carbide crystal in an oxygen atmosphere, and a process for etching the silicon (di)oxide thin film formed on the silicon carbide crystal surface.

In the above method, it is preferred to include a first step for implanting ions in at least a part of a surface of a SiC silicon carbide crystal to introduce crystal defects near the SiC crystal surface, a second step for heating the SiC crystal, in which the ions are implanted and the defects are introduced, in an oxygen atmosphere to form a silicon (di)oxide thin film on the SiC crystal surface, and a third step for etching the silicon (di)oxide thin film formed on the SiC crystal surface.

In the above method, it is preferred that the ion implanted in the SiC surface in the first step is at least one ion selected from the group consisting of oxygen, silicon, carbon, an inert gas, nitrogen, and hydrogen.

In order to achieve the above second objects, it is preferred to include a first step for supplying carbon to a Si substrate surface maintained at a low temperature of about 600° C. or lower to form a thin film containing carbon on the Si substrate surface, a second step for heating the Si substrate surface to cause a solid phase reaction between the Si substrate and the thin film containing carbon to carbonize the Si substrate surface to form silicon carbide, and a third step for supplying carbon and silicon after carbonization to grow silicon carbide so as to obtain a silicon carbide crystal film on the Si substrate.

In the above method, it is preferred to include a step for cleaning and removing an oxide film from the Si substrate surface to make the clean Si surface before supplying carbon.

In the above method, it is preferred that when silicon and carbon are supplied to the surface of the SiC to grow 3C—SiC having a (001) face, an abundance ratio of carbon to silicon on the silicon carbide surface is controlled under the condition where silicon atoms are always in excess of carbon atoms on the surface for growing silicon carbide.

In the above method, it is preferred that when silicon and carbon are supplied to the surface of the SiC to form 3C—SiC having a (111) face or an α-SiC thin film having a (0001) face, an abundance ratio of carbon to silicon on the silicon carbide surface is controlled under the condition where carbon atoms are always in excess of silicon atoms on the SiC growth surface.

In the above method using anisotropic Si substrate, it is preferred that a Si substrate surface used for growing a silicon carbide thin film on the Si substrate surface has anisotropy and comprises terraces and steps.

In order to achieve the above third objects, it is preferred that when silicon and carbon are supplied to the SiC surface to grow 3C—SiC having a (001) face, an abundance ratio of carbon to silicon on the silicon carbide surface is controlled under the condition where silicon atoms are always in excess of carbon atoms on the surface for growing silicon carbide.

In the above method, it is preferred to include a first step for implanting ions in a surface of a SiC silicon carbide crystal to introduce crystal defects in the silicon carbide crystal and a second step for heating the silicon carbide crystal substrate, in which the ions are implanted and the defects are introduced, in an oxygen atmosphere to form a silicon (di)oxide thin film.

Next, a first SiC device of the present invention comprises a surface having patterned steps and terraces and having a surface defect density of $10^8$ cm$^{-2}$ or less.

Next, a second SiC device of the present invention comprises at least a layered structure in which an n-type silicon carbide crystal is formed on an n-type Si substrate surface.

DETAILED DESCRIPTION

The disclosure of PCT/JP97/00855, filed Oct. 23, 1997, is incorporated herein by reference.

Figure 1A:
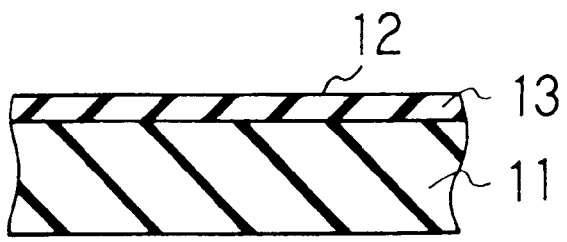
FIGS. 1A–C show a method for forming a clean surface according to a method for manufacturing a SiC device in an example of the present invention.
Figure 1B:
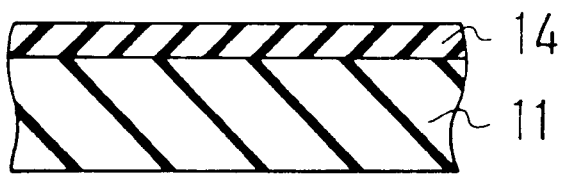
Figure 1C:
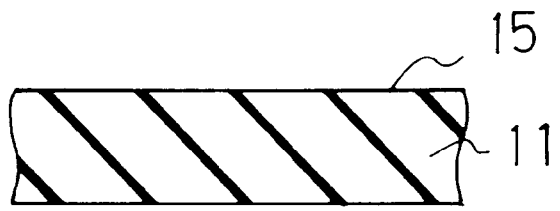

In the method for manufacturing a silicon carbide SiC device according to the present invention, a portion 13 having a high defect density near the surface 12 of a SiC crystal 11 shown in FIG. 1A is turned into a silicon (di)oxide thin film 14 by a thermal oxidation treatment as shown in FIG. 1B, and this silicon (di)oxide thin film is removed by etching the silicon (di)oxide thin film as shown in FIG. 1C to remove the portion having a high defect density near the silicon carbide surface and then a clean surface 15 of SiC is formed. In a conventional etching treatment with a HF group acidic solution used in a Si process, etching the surface of SiC, even it is defective, is difficult. However, in the present invention the portion 13 having a high defect density is changed into the oxide film first and then the oxide film to remove the portion having a high defect density near the surface to allow the surface of the silicon carbide to be cleaned. Therefore, a SiC clean surface can be formed using the oxidation and etching treatment in the Si process.

Figure 2A:
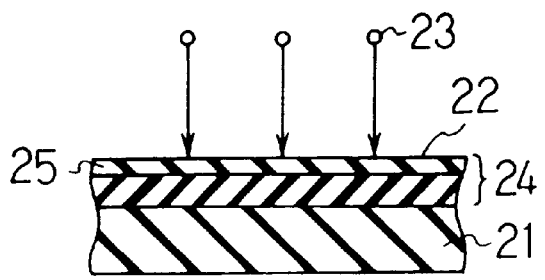
FIGS. 2A–E show a method for forming a patterned clean surface according to a method for manufacturing a SiC device in another example of the present invention.

In the above method, as shown in FIG. 2A, implanting ions 23 are introduced to a portion 24 having a high defect density near the SiC crystal surface 22 at a desired position and at a desired depth in a first step. The introduced defective portion 24 is deeper than the defect layer 25, which exists from the first, near the SiC surface. In a second step of thermal oxidation process, the oxygen is supplied into the crystal from the surface through the crystal defects introduced by the ion implantation; the area 24, into which the crystal defects are introduced by the ion implantation, is easily oxidized; carbon turns into a gas in the form of carbon oxide to be removed, and silicon (di)oxide is formed. This silicon (di)oxide thin film is removed by etching in a third step, so that a defect layer 25, which exists from the first, near the silicon carbide surface can be removed easily.

In the above method, it is preferred that the ion implanted in the SiC surface in the first step is selected from any of oxygen, silicon, carbon, an inert gas, nitrogen, and hydrogen, or a mixture thereof, so that the implanted ions form silicon (di)oxide or turn into a gas to be removed after oxidation.

In the above method, it is preferred that the dose of the implanted ions is more than $10^{14}$ ion/cm$^2$, so that sufficient crystal defects for oxide diffusion into SiC to remove carbon and to form silicon (di)oxide, a silicon (di)oxide insulating film is formed at high speed, an excess substance or structure is not formed at the SiO$_2$/SiC interface, an abrupt interface is formed, and a cleaner silicon carbide surface is formed after oxide film etching. At a dose less than this value, the oxidation does not fully proceed, defects remain, the interface of silicon (di)oxide/silicon carbide is not abrupt, and a clean surface cannot be formed after etching. In order to implant ions at a dose more than $10^{19}$ ion/cm$^2$, a very long time is required using the normal ion current density of a conventional ion implanting apparatus, and therefore the dose is preferably less than this value from a practical viewpoint. In this case, it is confirmed that the most effective and sufficient defect density for oxidation to proceed is obtained at a dose of about $10^{-}$ion/cm$^2$.

In the above method, it is preferred that the energy for the ion implantation is 1 keV to 10 MeV, so that an oxide insulating film is effectively formed and a cleaner silicon carbide surface is formed after oxide film etching. At 1 keV or less, the penetration depth of the implanted ions in the silicon carbide crystal is too small, and therefore the effect of ion implantation is small. At 10 MeV or more, the depth of penetration is too large, and the ions are implanted in a wide range, so that a very high density dose is required to achieve the sufficient defect density in the silicon carbide crystal. Also, the defect density of the surface is maintained low, so that oxidation from the surface proceeds with difficulty, and therefore such an ion implantation energy is not practical.

In the above method, it is preferred that multiple ion implantation is performed at different energies to form a deep and uniform implantation layer in the silicon carbide crystal, so that oxidation is performed to a deep portion, a thick silicon (di)oxide insulating film is formed, and the portion near the surface is uniformly removed after etching of the silicon (di)oxide film.

In the above method, it is preferred that the silicon carbide is maintained at 500° C. or lower during ion implantation, so that crystal defects introduced by ion implantation are quenched, stabilized, and inhibited from being annealed during ion implantation and from being changed into a structure having a certain stability; the crystal defects are introduced more efficiently; the diffusion of oxygen through the crystal defects is efficient; CO$_2$, a compound of carbon and oxygen, is efficiently discharged from the crystal to decrease the amount of residual carbon after oxidation to form a high performance SiO$_2$/SiC interface and a cleaner silicon carbide surface is formed after oxide film etching. It is also confirmed that in view of the problems of the apparatus and deterioration in the silicon carbide surface, the temperature of the silicon carbide is preferably the liquid nitrogen temperature, −195° C., or higher during ion implantation.

In the above method, it is preferred that ions are implanted in the SiC surface in the first step to form an amorphous layer near the SiC surface, and that the SiC containing the amorphous layer is oxidized in the second step. The amorphous layer is easily oxidized in the second step.

A method for forming a clean surface according to the method for manufacturing a SiC device according to the present invention comprises forming a defect layer by ion implantation, oxidizing it to form a silicon (di)oxide thin film on the silicon carbide surface, and removing this silicon (di)oxide thin film by etching. By forming a silicon (di)oxide thin film having a certain thickness and removing the portion, the impurities and defects present near the silicon carbide surface can be removed to form a clean surface. The crystal near the surface can be removed to any desired thickness, compared with the conventional surface treatment, and therefore a portion having a high defect density can be removed for cleaning. If the portion having a high defect density in the surface is thin, the defects near the surface also can be removed by forming a silicon (di)oxide thin film on the silicon carbide surface by a normal oxidation treatment, without using the method for forming a thick silicon (di)oxide thin film utilizing the above ion implantation, and etching the silicon (di)oxide thin film. By repeating the silicon (di)oxide thin film formation and etching several times, a cleaner silicon carbide surface can be formed.

In the above method, it is preferred that a part of the SiC surface is masked and a portion where ions are implanted is patterned during ion implantation to the SiC surface in the first step. This pattern determines the structure of the surface after the third step, so that a trench structure or the like required for a SiC device can be formed.

Figure 2B:
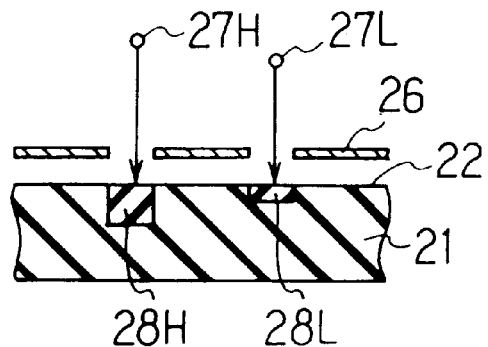
Figure 2C:
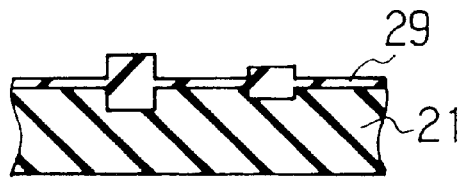
Figure 2D:
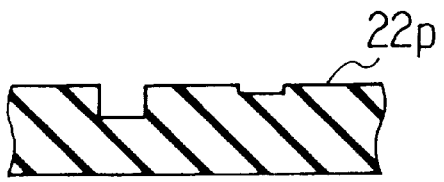
Figure 2E:
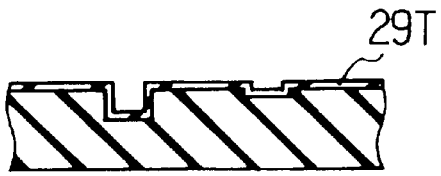

In the above method, it is preferred that when ions are implanted to the SiC surface in the first step, at least one of the energy of implanted ions, ion species, and ion density is different depending on the place on the SiC surface so that patterning is performed. By changing the ion energy or the ion species, the depth of the damage layer from the surface can be changed, so that terraces, steps and a trench structure having any depth can be formed with good reproducibility. In other words, the above method for manufacturing a SiC device can be applied for forming a surface structure having the shape of a trench structure or the like on the silicon carbide surface. In the formation of a silicon (di)oxide film in the first and second steps in the surface treatment method of the present invention, the depths and amounts of the implanted ions and the crystal defects can be patterned freely by changing masking or the energy or dose for ion implantation. By subjecting this patterned defect portion to the oxidation treatment, the patterned oxide film can be formed at high speed. As shown in FIG. 2B, by forming or providing a mask 26 on the surface 22 of the silicon carbide substrate 21, the area for ion implantation can be patterned. Depending on the place, a defect is introduced deep in a portion 28H where a high energy ion 27H is implanted, and a shallow defect is introduced in a portion 28L where a low energy ion 27L is implanted. These defects are subjected to the oxidation treatment, so that a patterned silicon (di)oxide film 29 having any desired thickness in any desired area can be formed as shown in FIG. 2C. This patterned silicon (di)oxide itself can be utilized for an electronic device. Furthermore, this patterned silicon (di)oxide thin film is further removed by etching in the third step, so that a silicon carbide surface 22P having the patterned clean surface is formed as shown in FIG. 2D. This patterned silicon carbide clean surface is subjected to the oxidation treatment again, so that a thin silicon (di)oxide thin film 29T having a clean interface can be formed on the surface (side) of the trench structure as shown in FIG. 2E. By repeating the above oxidation treatment and etching several times, a surface structure having any desired shape such as a trench structure having a cleaner surface (side) can be formed.

The above cleaning is effective not only for a flat surface of SiC but also for a silicon carbide surface on which patterned steps and terraces are formed by normal reactive ion etching, ion milling, plasma etching, laser etching, or etching by mechanical cutting or grinding. In other words, the defect portion introduced near the surface during the etching process used for forming the above pattern is easily changed into a silicon (di)oxide thin film by an oxidation treatment, so that the defect layer can be removed by etching the oxide film.

In the above method, it is preferred that the silicon carbide surface on which patterned steps and terraces are formed by the etching treatment is heated in an oxygen atmosphere to form a silicon (di)oxide thin film and that the defects introduced by the etching treatment are removed by further etching of the silicon (di)oxide thin film. The defects introduced by various etching treatments can be removed to form an applicable electronic SiC device.

In the above method, it is preferred that the etching treatment is performed by at least one type of method among reactive ion etching, ion milling, plasma etching, laser etching, mechanical cutting and grinding. All the defects introduced by the above etching treatment can be removed as a silicon (di)oxide film by the above oxidation or the oxidation treatment after ion implantation.

Figure 3A:
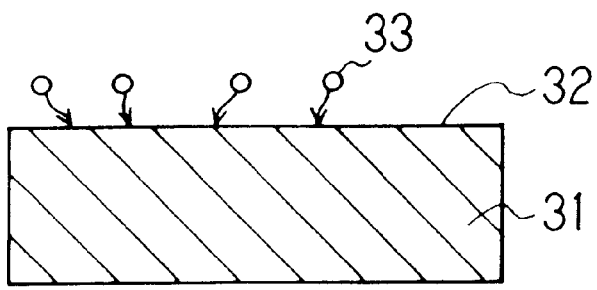
FIGS. 3A–C show a conceptual view for the process of a method for growing SiC on a Si(001) substrate in another example of the present invention.
Figure 3B:
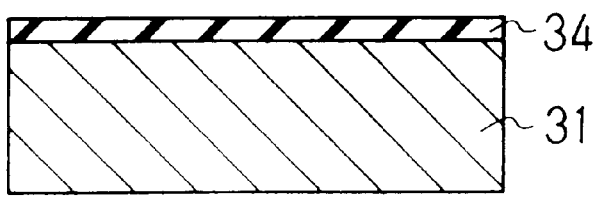
Figure 3C:
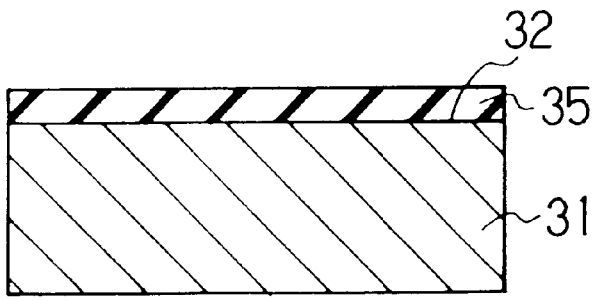

FIGS. 3A–3C show a conceptual view for the process of a method for growing SiC according to the method for manufacturing a SiC device of the present invention. For a first step, substances 33 containing carbon are supplied to the surface 32 of a Si substrate 31 in FIG. 3A for a first step to form a thin film 34 containing carbon as shown in FIG. 3B. In the first step, the Si substrate surface is maintained at a low temperature so that the reaction between the supplied substances 33 containing carbon and the Si substrate surface 32 does not occur, silicon carbide is not formed, and the thin film 34 containing carbon is formed on the Si substrate surface. Then, the Si substrate surface is heated in a second step to proceed a solid phase reaction between the thin film 34 containing carbon and the Si substrate surface 32. The heating in the second step results in the carbonization of the Si substrate surface 32 and formation of the SiC thin film 35 on the Si substrate surface 32 as shown in FIG. 3C. The normal conventional carbonization treatment, such as a reaction between a gas containing carbon, for example hydrocarbon, and a Si substrate surface starts at the highly reactive sites of the Si substrate surface, such as the surface defects or the atomic steps of the surface, and therefore the uniformity of the reaction is bad. This local difference in reactivity is reflected in the inequality of the formed SiC/Si interface to cause the formation of lattice defects, twins, pits or the like. In the present invention, different from the normal conventional carbonization treatment, the Si substrate surface is maintained at low temperature to suppress the local reaction between carbon and the Si substrate surface in the first step and form a uniform thin film containing carbon on the Si substrate surface. The carbonization is carried out by the solid phase reaction between the thin film 34 containing carbon and the Si substrate surface 32 in the second step, so that a uniform carbonization reaction occurs on the Si substrate surface. By the first and second steps, a silicon carbide/Si interface having excellent uniformity is formed, so that the formation of defects such as lattice defects, twins, or pits is inhibited. By growing the SiC thin film in a third step in which carbon and silicon are supplied on this SiC/Si interface having excellent uniformity, a SiC film having few defects and having good quality can be formed on the Si substrate surface.

In the above method, it is preferred that the Si substrate surface is maintained in a temperature range of the liquid nitrogen temperature, −195° C., to 600° C. in the first step. At a temperature above 600° C., carbon reacts with the Si substrate surface before a thin film containing carbon is formed, so that non-uniform SiC is formed. A temperature less than −195° C. (the liquid nitrogen temperature) can not easily be obtained.

In the above method, it is preferred that the thin film formed on the Si substrate surface by the first step contains carbon corresponding to a thickness of a 1-atomic layer to a 20-atomic layer. With a 1-atomic layer or less, uniform carbonization is not carried out on the Si surface. With a 20-atomic layer or more, the carbon thin film is stable, so that the reaction with the Si substrate does not easily occur.

In the above method, it is preferred that the thin film formed on the Si substrate surface in the first step is an amorphous thin film containing carbon. The amorphous thin film is highly reactive with the Si substrate, and carbonization occurs more easily than with crystal thin films.

In the above method, it is preferred that the substance containing carbon supplied to the Si substrate surface in the first step contains at least molecular carbon other than a gas such as hydrocarbon. Reaction with hydrocarbon or the like includes a reaction such as cracking hydrogencarbon bonds. Such a reaction is complicated and can not be easily controlled. However, if molecular carbon is contained, the reaction with Si easily occurs and can be easily controlled.

In the above method, it is preferred that the Si substrate surface is heated to a temperature range of 800° C. to 1414°

C., the melting point of Si, in the second step. The carbonization reaction on the Si substrate surface occurs at 800° C. or higher. At a temperature equal to or higher than the melting point of Si, the substrate melts and cannot be used.

In the above method, it is preferred that the temperature increase rate between 600° C. and 1000° C. for the Si substrate surface heating is 20° C./min. to 500° C./min. in the second step. With a temperature-increase rate of 500° C./min. or more, uniform carbonization cannot be carried out. With 20° C./min. or less, the heating takes too long and is not suitable from the industrial viewpoint.

In the above method, it is preferred that at least the first and second steps are carried out under a high vacuum of not more than $10^{-7}$ Torr. If the Si substrate is heated under a lower vacuum than this, the surface is oxidized or the like. Therefore uniform carbonization cannot be carried out.

In the above method, it is preferred that at least the first and second steps are carried out by a MBE process under high vacuum, and the third step or a part of the third step is carried out by a CVD process providing a fast growth rate. In the MBE, the above high vacuum is easily achieved. In the CVD, high speed film formation that is preferable from the industrial viewpoint is achieved.

In the above method, it is preferred to include a step for removing an oxide film from the Si substrate surface to clean the surface before supplying carbon. The presence of the oxide film on the Si substrate surface degrades the uniformity and reproducibility of carbonization, and therefore it is preferred to form a Si clean surface beforehand. In other words, it is confirmed that if the step for removing the oxide film or the like from the surface of the Si substrate for cleaning is carried out before the supply of carbon, the carbonization process becomes efficient. When carbon is supplied to the Si clean surface for carbonization, C and Si directly react with each other efficiently, so that the rows of the Si dangling bonds in the Si [110] direction exposed on the Si(001) surface are bonded to C atoms (adatom) to form a SiC atomic configuration whose SiC [110] rows are formed by the shrinkage of the Si [110] rows with C atoms. As a result, a SiC/Si uniform and abrupt heteroepitaxial interface is formed. If impurities such as the oxide film on the Si surface are present on the surface, the shrinkage of the above Si [110] atomic rows occurs inequally, so that a flat SiC/Si heteroepitaxial interface having few defects is not easily formed, and a SiC thin film obtained by the growth on this SiC/Si interface also has many defects. A uniform SiC/Si heteroepitaxial interface having few defects can be formed by carbonization with the process for forming a clean Si surface.

In the above method, it is preferred that the cleaned Si surface has a Si(001)2×1 surface reconstruction structure. The 2×1 structure can be used as the indicator of the Si(001) clean surface. On a hydrogenated 1×1 surface, desorption of hydrogen from the surface during the carbonization reaction, degrades the uniformity of the carbonized interface.

In the above method, it is preferred that the step for cleaning the Si substrate surface comprises a step of heating the substrate to a temperature of 800° C. or higher under a high vacuum of not more than $10^{-6}$ Torr or in a hydrogen atmosphere. By this step, a clean surface of the above mentioned Si substrate can be formed. Heating under low vacuum causes oxidation of the Si substrate surface, degradation of the uniformity and reproducibility of SiC formation after the carbonization.

In the above method, it is preferred that the step for cleaning the Si substrate surface comprises a step of irradiating the substrate surface with ultraviolet light such as excimer lasers. By irradiation with the ultraviolet light, the above Si substrate clean surface can be formed even at lower temperature.

In the above method, it is preferred that the step for cleaning the Si substrate surface comprises a step of exposing the Si substrate surface to a reactive etching gas such as ozone and chlorine or chloride and fluorine or a fluoride gas. By etching the Si substrate surface with these gases, a cleaner surface can be obtained.

In the above method, it has been discovered that by exactly controlling the abundance ratio of carbon to silicon on the surface for growing silicon carbide enables a high performance epitaxial thin film, in which a smooth surface is obtained with good reproducibility without the growth of twins. Based on this discovery, the method for manufacturing a silicon carbide thin film has been invented. Also, it has been discovered that monitoring the surface rearrangement structure of the above silicon carbide growth surface enables the in-situ control of the abundance ratio of carbon to silicon on the growth surface. Based on this discovery, an apparatus for manufacturing a silicon carbide thin film has been invented.

If the abundance ratio of silicon to carbon on the silicon carbide growing surface is 1 or more (excess silicon), the (001) face of a 3C—SiC selectively appears. Under this conditions, the growth of twins is inhibited, so that a smooth (001) face of a cubic crystal silicon carbide thin film can be obtained. If the silicon/carbon abundance ratio for the uniform growth surface is 2 or more (in an excess silicon state) a single crystal of silicon begins to grow on the silicon carbide surface, inhibiting the growth of the silicon carbide thin film. By maintaining and keeping the silicon/carbon abundance ratio for the growth surface greater than 1 and equal to or less than 2, a smooth and clean cubic crystal silicon carbide (001) face can be obtained. In this case, the structure of the growth surface has a 3×2 or 5×2 surface rearrangement. By monitoring this surface structure, the abundance ratio of silicon to carbon on the growing surface can be easily controlled.

In other words, in the method for manufacturing a SiC device, it is preferred that when supplying silicon and carbon to the surface of the SiC to grow 3C—SiC having a (001) face, the abundance ratio of the carbon to the silicon on the silicon carbide surface is controlled so that silicon atoms are always in excess of carbon atoms on the surface for growing silicon carbide.

In the above method, it is preferred that the abundance ratio of carbon to silicon on the silicon carbide surface is controlled so that the (001) growing surface of the 3C—SiC is kept to have a 3×2 or 5×2 surface rearrangement during the growth.

In the above method, it is preferred that the abundance ratio of carbon to silicon on the silicon carbide surface is controlled so that the abundance ratio of the silicon atoms to the carbon atoms on the (001) growth surface of the 3C—SiC is kept at greater than 1 and equal to or less than 2, in an excess silicon state during the growth.

In the above method, it is preferred that when supplying silicon and carbon to the surface of the SiC to form a 3C—SiC thin film having a (001) face, an instrument that can evaluate the surface structure of silicon carbide in-situ during growth, such as a reflective high energy electron diffraction instrument, is included in a SiC formation apparatus to monitor the 3×2 or 5×2 structure of the 3C—SiC (001) surface, and an apparatus having a mechanism for controlling the abundance ratio of carbon to silicon on the SiC surface is used so that the surface reconstructions of 3×2 and 5×2 are constantly observed.

On the other hand, under the conditions of excess carbon, that is, a silicon/carbon abundance ratio of less than 1, a cubic crystal silicon carbide (111) face or a hexagonal crystal silicon carbide (0001) face selectively appears. Under this conditions, the above cubic crystal silicon carbide (111) face or the hexagonal crystal silicon carbide (0001) face grows smoothly with good reproducibility. However, under the conditions of excess carbon, that is, a silicon/carbon abundance ratio of 0.5 or less, the grown silicon carbide thin film turns into a polycrystal so that crystallites grow in random directions. By maintaining the silicon/carbon abundance ratio for the growing surface more than 0.5 and less than 1, a smooth and clean cubic crystal silicon carbide (111) face or a hexagonal crystal silicon carbide (0001) face can be obtained. In other words, in the method for manufacturing a SiC device, it is preferred that when silicon and carbon are supplied to the surface of the SiC to form a 3C—SiC having a (111) face or an α-SiC thin film having a (0001) face, the abundance ratio of the carbon to the silicon on the silicon carbide surface is controlled under the condition where the carbon atoms are always in excess of the silicon atoms on the SiC growth surface.

In the above method, it is preferred that the abundance ratio of carbon to silicon on the SiC surface is controlled so that the ratio of the silicon atoms to the carbon atoms on the 3C—SiC(111) or α-SiC(0001) growth surface is 0.5 to 1, in an excess carbon state.

In the above method, it is preferred that when silicon and carbon are supplied to the surface of the SiC to form a 3C—SiC thin film having a (111) face or an α-SiC thin film having a (0001) face, an instrument that can evaluate the surface structure of silicon carbide during growth, such as a reflection high energy electron diffraction instrument, is included in a SiC formation apparatus to constantly observe the state of the 3C—SiC(111) surface in-situ, and an apparatus having a mechanism for controlling the abundance ratio of carbon to silicon on the SiC surface and inhibiting the growth of a crystal other than SiC is used.

With respect to the heteroepitaxial growth on a silicon wafer, the following has been found. After a silicon wafer surface is cleaned by heating under a vacuum of not more than $10^{-8}$ Torr before the carbonization treatment, silicon is supplied to the wafer surface to cause the epitaxial growth of the silicon, and this low-defect epitaxial Si surface is subjected to the carbonization treatment, so that a heteroepitaxial silicon carbide thin film having few twins and good crystallinity can be formed.

With respect to heteroepitaxial growth on a silicon wafer, first, a silicon wafer (001) surface is heated under a vacuum of $10^{-8}$ Torr to form a clean surface having a Si(001) 2×1 surface rearrangement. It has been found that silicon is then supplied to the wafer surface to grow the homoepitaxial silicon to further form a clean surface, and this surface is subjected to the carbonization treatment, so that a heteroepitaxial silicon carbide thin film having few twins and good crystallinity can be formed. The silicon wafer surface cleaned by heating under vacuum often contains many defects depending on the previous cleaning condition, the vacuum, and the impurities in vacuum and therefore is not easily controlled. However, the surface is clean and has few defects after the homoepitaxial growth of the silicon, so that the heteroepitaxial silicon carbide thin film formed by the subsequent carbonization treatment has an improved crystallinity and a good reproducibility.

Figure 4:
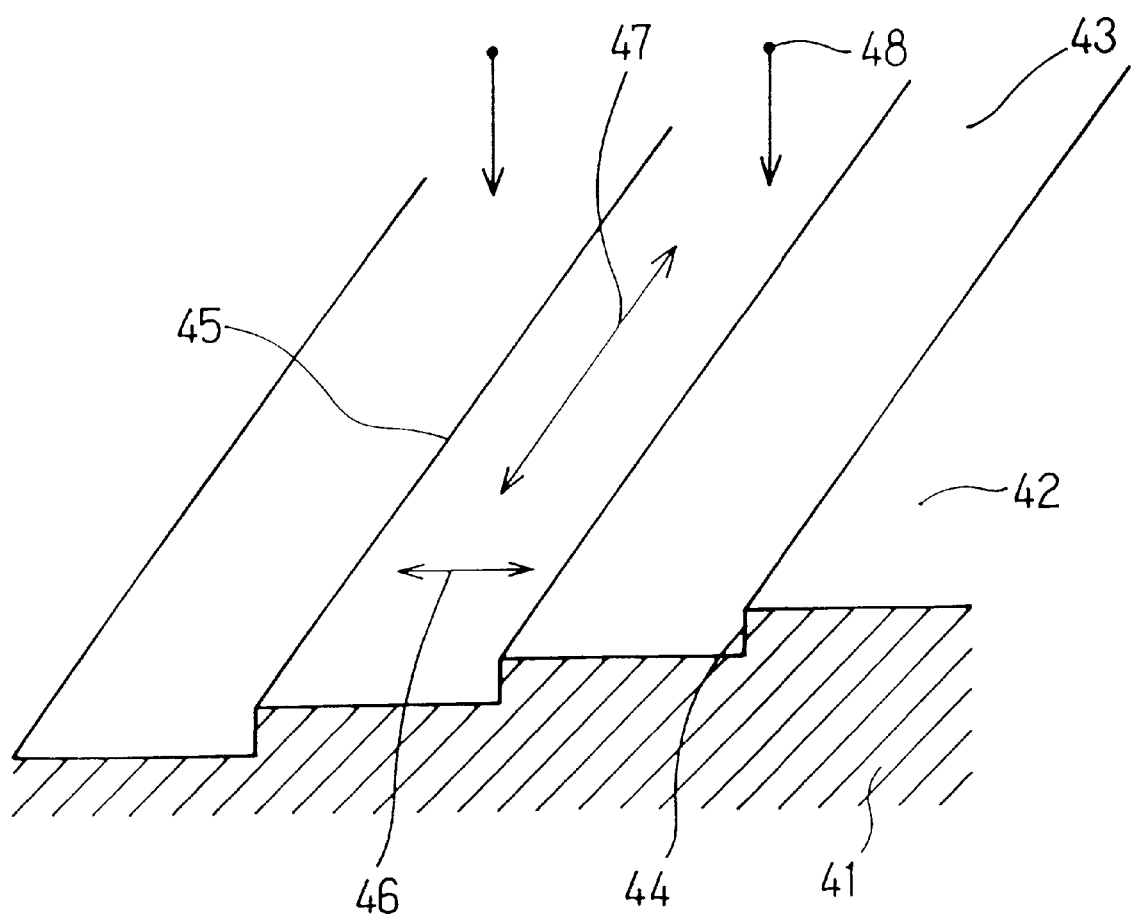
FIG. 4 shows a conceptual view of the growth of SiC on a Si surface having anisotropy in another example of the present invention.

FIG. 4 shows a schematic view of a Si substrate 41 surface into which terraces and steps are introduced with anisotropy, as a substrate for heteroepitaxial SiC growth according to the method for manufacturing a SiC device according to the present invention. A Si(001) surface 42 is off-cut inclined in the [110] direction, and terraces 43 and steps 44 are introduced. The width of the terrace 43 (the direction perpendicular to a step edge 45: an N direction 46 in FIG. 4) is much shorter than the length of the terrace parallel to the step edge (a P direction 47 in FIG. 4). When the off-cut angle is 4 degrees and the height of the step 44 is a 1-atomic layer, the width of the terrace 43 is about 2 nm. This short Si [110] atomic row (the N direction 46 in FIG. 4) easily reacts with carbon to shrink and form a SiC atomic structure more than the long Si [110] atomic row in the P direction 47 in FIG. 4. In other words, on the surface into which the terraces and the steps are introduced, the Si [110] atomic rows in the width direction of the terraces (the N direction 46 in FIG. 4) selectively shrink to form a SiC atomic structure with supplied carbon 48. Thus, the inventor has confirmed that two phases of the [Si] 3C—SiC crystal grains, which are formed on a just-cut Si(001) surface and are a problem, are limited to one phase by introducing the terraces and the steps. This invention enables the formation of a single-phase 3C—SiC single crystal thin film.

When supplying the carbon 48 to the Si(001) surface comprising the terraces 43 and the steps 44 for carbonization to form SiC crystal grains, twins are sometimes formed if the carbon 48 is supplied as a gaseous substance such as hydrocarbon. The inventor has confirmed that the formation of twins is inhibited if a carbon source containing molecular beams such as molecular carbon or carbon atoms is supplied. This is probably caused by the following reason. With respect to the reaction between the gas phase carbon source and the Si surface, it is believed that the reaction with carbon starts from the Si atoms in the most reactive state on the Si surface. The Si atoms in the most reactive state on the Si surface are the atoms in the position of the step edges 45 present on the surface. It is believed that the carbonization of the Si surface 42 caused by the gas phase carbon 48 starts from the step edges 45, and twins having different azimuths easily grow at the step edges 45. On the other hand, if not only the gas phase carbon but also the carbon source containing molecular beams such as carbon atoms are supplied, the reaction with the Si substrate starts from any position where the carbon is supplied, so that the reaction is inhibited from selectively occurring from the position of the step edges 45, and the reaction occurs on the terraces 43. Thus, it is confirmed that the twin growth from the position of the step edges 45 is inhibited as well, so that a SiC crystal thin film having few twins is formed. In this case, if the carbon is supplied at low temperature in the first step, a carbon thin film is formed on the substrate surface 42 without the reaction (or with small reaction) between the carbon and the substrate surface 42, and then a solid phase reaction between the carbon thin film and the substrate surface occurs at the elevated temperature at which carbonization is processed in the second step. Therefore, the above SiC crystal grains having the same direction are uniformly formed as described in FIG. 3.

In other words, in the method for manufacturing a SiC device according to the present invention, it is preferred that the Si substrate surface used for growing a silicon carbide thin film on the Si substrate surface has anisotropy and comprises terraces and steps.

In the above method, it is preferred that the width of the terrace of the Si substrate surface is 0.5 nm to 100 nm. If the width is less than 0.5 nm, the reaction occurs significantly at the steps, so that the twins are contained. If the width is more than 100 nm, the anisotropy provided by the terraces and the steps of the substrate is long range and does not affect the carbonization process.

In the above method, it is preferred that the Si substrate surface having anisotropy is a miscut face of the Si(111) or (001). Due to the miscut, the above terraces and steps appear on the surface.

In the above method, it is preferred that the Si substrate surface is a miscut face of the Si(001), and that the angle between the direction of the step edges caused by the miscut and the Si <110> crystal axis direction is 0 to 30 degrees. The Si(001) surface obtained by this miscut direction exhibits directional anisotropy about the two perpendicular-to-each-other <110> direction and enables the growth of SiC having the same phase. Outside of this range, the anisotropy is insufficient.

In the above method, it is preferred that when supplying silicon and carbon to the SiC surface to grow 3C—SiC having a (001) face, the abundance ratio of the carbon to the silicon on the silicon carbide surface is controlled so that the silicon atoms are always in excess of the carbon atoms on the surface for growing silicon carbide. With excess Si, the SiC(001) surface is stabilized, so that good crystal growth proceeds. Also, the crystal growth under the conditions of excess Si provides selective growth in the 3C—SiC[110] direction, so that this growth easily occurs on the terraces in the P direction 47 in FIG. 4 to promote the growth of single-phase SiC.

In the above method, it is preferred that the abundance ratio of carbon to silicon on the silicon carbide surface is controlled so that the 3C—SiC(001) growth surface has a 3×2 or 5×2 surface rearrangement. These structures serve as the indicator of the excess Si surface.

In the above method, it is preferred that the abundance ratio of carbon to silicon on the silicon carbide surface is controlled so that the abundance ratio of the silicon atoms to the carbon atoms on the 3C—SiC (001) growth surface is greater than 1 and equal to or less than 2, in an excess silicon state. The excess Si surface having an abundance ratio greater than this range causes growth of the Si crystal grains to inhibit a good SiC crystal growth.

In the above method, it is preferred that when supplying silicon and carbon to the surface of the SiC to form a 3C—SiC thin film having a (001) face, an instrument that can evaluate the surface structure of silicon carbide during growth, such as a reflective high energy electron diffraction instrument, is included in a SiC formation apparatus to monitor the 3×2 or 5×2 structure of the 3C—SiC(001) surface, and an apparatus having a mechanism for controlling the abundance ratio of carbon to silicon on the SiC surface is used so that a 3×2 period or a 5×2 period is constantly observed. By introducing this apparatus, the SiC crystal growth in the excess Si state can be precisely controlled easily.

Figure 5:
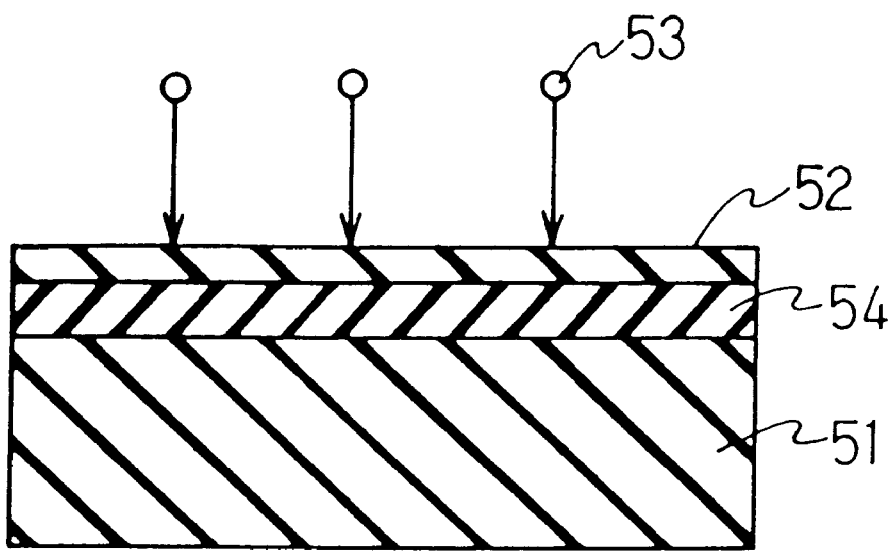
FIG. 5 shows a method for forming a silicon (di)oxide insulating film according to a method for manufacturing a SiC device in another example of the present invention.
Figure 6:
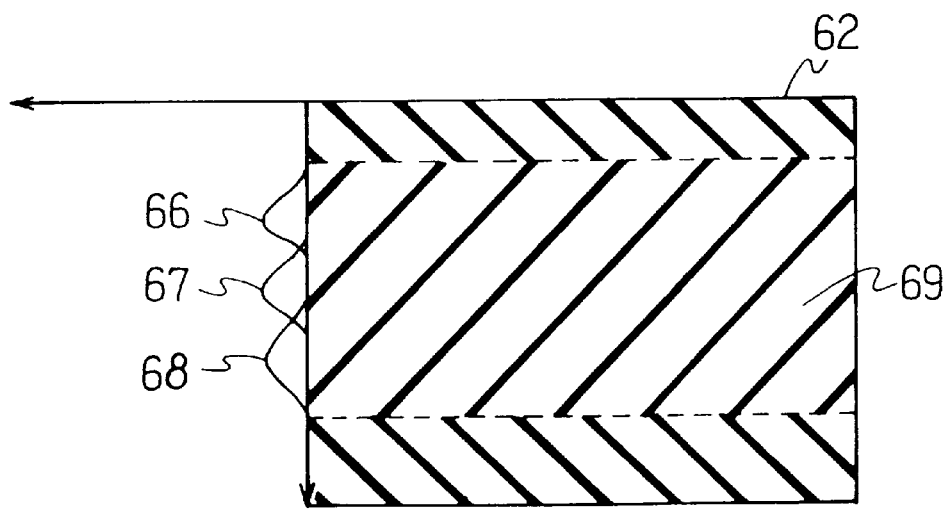
FIG. 6 shows a method for forming a silicon (di)oxide insulating film according to a method for manufacturing a SiC device in another example of the present invention.

A method for forming an insulating film on the SiC surface after cleaning; formation and etching of silicon (di)oxide thin film on SiC, according to the method for manufacturing a SiC device of the present invention comprises implanting ions 53 (in FIG. 5) in the SiC crystal surface before conventional thermal oxidation. By implanting the ions 53 from the surface 52 of a SiC crystal 51 as shown in FIG. 5, a crystal defect 54 is introduced near the SiC crystal surface in the first step. The oxygen, supplied by diffusion into the crystal from the surface in the conventional thermal oxidation in the second step, is supplied through the crystal defect 54 introduced by the ion implantation, so that the SiC is oxidized efficiently and rapidly in the range 54 in which the crystal defects are introduced by the ion implantation, and the carbon turns into a gas in the form of carbon oxide to be removed, and therefore silicon (di)oxide is formed. In the formation of a silicon (di)oxide film according to the present invention, the depth and the amount of the implanted ions and the crystal defects can be freely changed depending on the controllable energy and dose for ion implantation. Therefore, an oxide film can be formed at any desired depth at high speed to solve the problem of a very slow oxidation speed of the conventional thermal oxidation. In this case, if the dose of the implanted ions is $10^{14}$ ions/cm$^2$ or more, the crystal defects introduced by the ion implantation in the first step has a sufficient density for discharging carbon and forming silicon (di)oxide in the oxidation in the second step, so that a high performance silicon (di)oxide insulating film is formed. If the dose is $10^{14}$ ions/cm$^2$ or less, the density of the introduced defects is low, so that the thickness of the formed oxide film is not different from that without ion implantation. In view of the problem of the apparatus, the dose is preferably $10^{19}$ ions/cm$^2$ or less. With a dose of this value or more, a special ion gun or long ion-implantation time is required, and therefore such a dose is not practical. Also, if the silicon carbide is maintained at 500° C. or lower for ion implantation, the crystal defects introduced by ion implantation are inhibited from being annealed and being changed into a stabilized structure during the ion implantation, crystal defects are more efficiently introduced, the diffusion of oxygen through the crystal defects is efficient, and CO$_2$, a compound of carbon and oxygen, is efficiently discharged from the crystal to decrease the amount of the residual carbon after oxidation to form a high performance silicon (di)oxide insulating film. In view of the problem of the apparatus and the problem of deterioration in the silicon carbide surface, it is confirmed that the temperature of the silicon carbide during ion implantation is preferably between the liquid nitrogen temperature and 500° C. If the energy for ion implantation is 1 keV to 10 MeV, an oxide insulating film can be effectively formed. If the energy is 1 keV or less, the depth of the penetration of the implanted ions in the silicon carbide crystal is too small, and therefore the effect of the ion implantation is small. If the energy is 10 MeV or more, in addition to requiring a special apparatus for implanting such high energy ions, the depth of penetration is too large, and ions are implanted in a wide range, so that a very high density dose is required to achieve the sufficient defect density in the silicon carbide crystal. Therefore, such an ion implantation energy is not practical. Also, crystal defects are formed in a region very deep from the surface, and a few or no defects are present near the surface. Therefore, oxygen is not sufficiently supplied from the surface in the oxidation of the second step, so that oxidation does not proceed. When forming a thick silicon (di)oxide insulating film, it is effective to form a deep and uniform implantation layer 69 in the silicon carbide crystal by carrying out multiple ion implantations 66, 67 and 68 with different energies from a SiC surface 62 as shown in FIG. 6. Furthermore, it is confirmed that if ions are implanted in the SiC surface to form an amorphous layer near the SiC surface in the first step, and the SiC comprising the amorphous layer is oxidized in the second step, a good silicon (di)oxide thin film is formed.

In other words, it is preferred that the method for manufacturing a SiC device comprises a first step for implanting ions in the surface of a SiC silicon carbide crystal after cleaning to introduce crystal defects in the silicon carbide crystal and a second step for heating the silicon carbide crystal substrate in which the ions are implanted and the defects are introduced in an oxygen atmosphere to form a silicon (di)oxide thin film.

In the above method, it is preferred that the ions implanted in the SiC surface in the first step are selected from any of oxygen, silicon, carbon, an inert gas, nitrogen, and hydrogen, or a mixture thereof. These gases effectively introduce defects in the SiC crystal, and, after oxidation, form silicon (di)oxide or turn into gases to be discharged, and therefore they do not remain to provide negative effects.

In the above method, it is preferred that the dose of the ions implanted in the SiC surface in the first step as described above is $10^{14}$ ions/cm$^2$ or more.

In the above method, it is preferred that the energy of the ions implanted in the SiC surface in the first step as described above is between 1 keV and 10 MeV.

In the above method, it is preferred that two or more types of energies of the ions implanted in the SiC surface in the first step as described above are selected for multiple implantation.

In the above method, it is preferred that when implanting ions in the SiC surface in the first step as described above, the SiC is maintained at 500° C. or lower.

In the above method, it is preferred that ions are implanted in the SiC surface to form an amorphous layer near the SiC surface in the first step, and that the SiC containing the amorphous layer is oxidized in the second step. The amorphous phase is less stable than the crystal phase, so that the amorphous phase is easily oxidized to form a silicon (di) oxide thin film.

By the surface cleaning step according to the above method for manufacturing a SiC device, a SiC device can be formed first which comprises a surface having patterned steps and terraces and has a surface defect density of $10^8$ cm$^{-2}$ or less.

Figure 7:
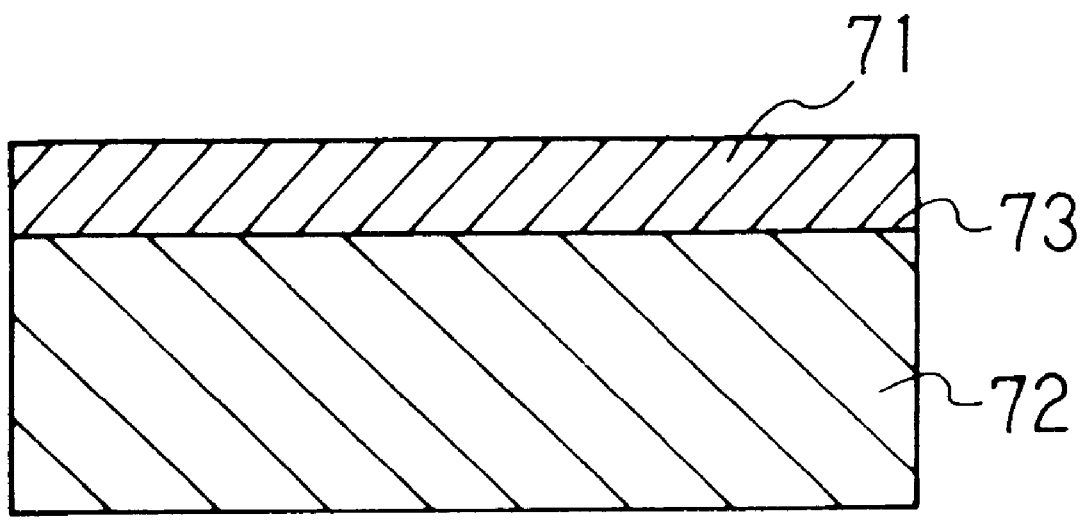
FIG. 7 shows a basic structure of a silicon carbide semiconductor device in another example of the present invention.
Figure 8:
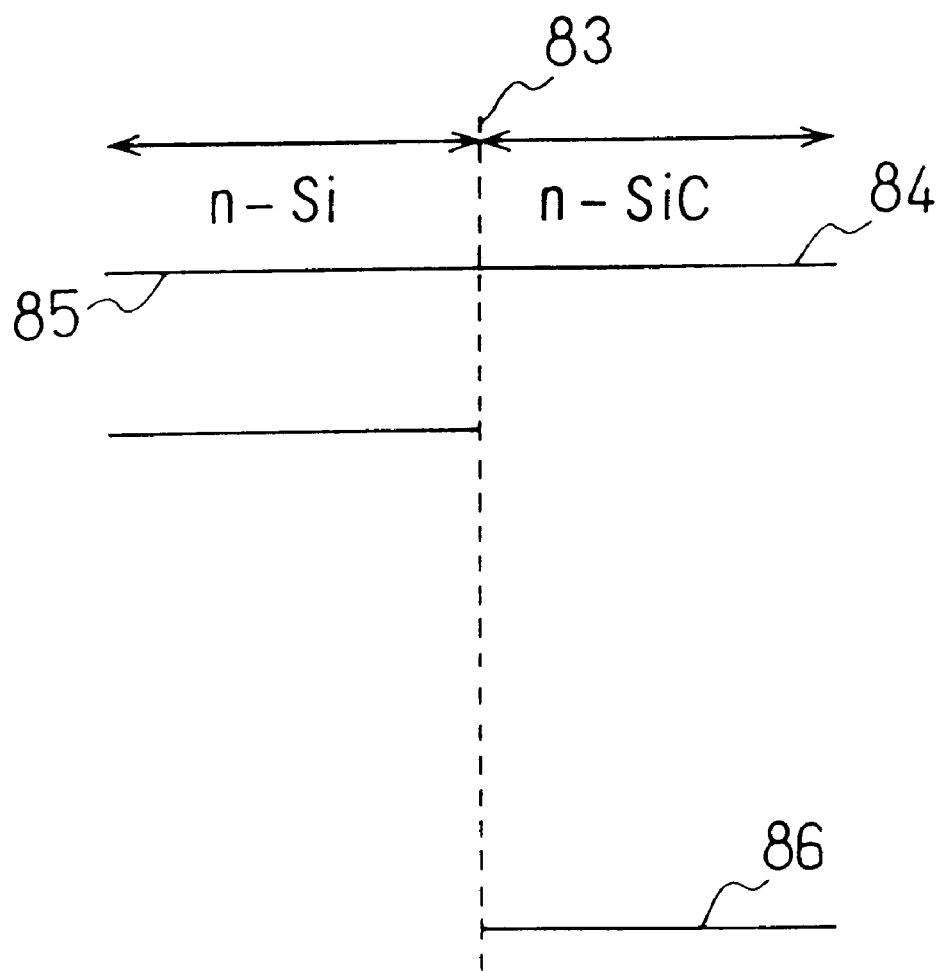
FIG. 8 is a band view of a silicon carbide semiconductor device in another example of the present invention.

FIG. 7 shows the basic structure of the SiC device of the present invention. The structure is a layered structure comprising a silicon carbide/Si interface 73 with an n-type silicon carbide crystal 71 formed on the surface of an n-type Si substrate 72 as shown in FIG. 7. In this layered structure, the conduction band 84 of the n-type silicon carbide crystal is smoothly connected to the conduction band 85 of the n-type Si crystal substrate at a silicon carbide/Si interface 83 as shown in the band diagram of FIG. 8. Since the main carrier is the electrons in the n-type semiconductor, such a factor that inhibits electron movement is not present at the interface of this silicon carbide/Si layered structure, allowing current to flow without resistance. In other layered structures, p-type SiC/p-type Si, for example, a valence electron band 86, in which holes exist as the main carrier, is not smoothly connected as the conduction band in the above n-type SiC/n-type Si. Therefore, a step is produced at the silicon carbide/Si interface 83, a voltage drop occurs in the forward direction, and resistance is generated with the carrier movement (the current flow). In these other types of layered structures, the electric conduction has resistance at the silicon carbide/Si interface 83. This resistance causes a problem when a vertical-type silicon carbide power device is formed using the silicon carbide formed on a Si substrate surface. It is confirmed that the resistance is minimum when the above silicon carbide/Si layered structure in which the n-type silicon carbide contacts the n-type Si substrate is included. The layered structure having an n-SiC/n-Si structure according to the present invention is effective for various types of silicon carbide semiconductor devices in which current flows across this interface, and devices such as low loss Schottky diodes, metal oxide semiconductor field effect transistors (MOSFET), metal semiconductor field effect transistors (MESFET) and insulated gate bipolar transistor (IGBT) can be formed.

In other words, it is preferred that the above SiC device comprises at least a layered structure in which an n-type silicon carbide crystal is formed on an n-type Si substrate surface.

In the above SiC device, it is preferred that the resistivity of the n-type Si substrate is $10^2$ Ω•cm or less. When a vertical-type SiC device is formed on a conductive Si substrate having a resistivity of the above value or lower, current easily flows in the Si substrate, and the heat generating power loss cause by the current is less, so that a highly efficient SiC device can be implemented.

Also, it is preferred that the above SiC device comprises at least a Schottky diode comprising a layered structure in which an n-type silicon carbide crystal is formed on an n-type Si substrate surface. According to such a structure, a vertical-type Schottky diode can be formed in which the electric junction at the SiC/Si interface is negligible and high breakdown voltage and low loss can be implemented.

EXAMPLE 1

Using a commercially available product (a SiC wafer manufactured by CREE Corporation in the United States), the 6H—SiC(0001) silicon carbide wafer Si face, in which many defects due to surface polishing are contained near the surface, was introduced into a normal wet oxidation apparatus for the Si process to carry out an oxidation treatment in a wet oxidation atmosphere, in which oxygen was bubbled with boiling water for flow supply, at 1100° C. for 1 hour. The thus formed oxide film had a thickness of about 40 nm. The refractive index of this oxide film was measured by ellipsometry. However, a reasonable value for a silicon (di)oxide film was not obtained. It seems that because of the defects or impurities near the surface, a clean $SiO_2$/SiC interface was not formed. This oxide film was subjected to a buffered hydrofluoric acid treatment, in which the oxide film was dissolved in a mixed solution of hydrofluoric acid and an aqueous solution containing 40 vol. wt % of ammonium fluoride (for example, a ratio of the hydrofluoric acid to the aqueous solution containing 40 vol. wt % of ammonium fluoride is 1:6), for removal. The defect layer near the surface was removed, and a clean surface was formed. This clean surface was introduced into the above oxidation apparatus again to carry out the above oxidation treatment again. The refractive index of the second oxide film was measured with an ellipsometer. The refractive index was 1.45 with a thickness of 30 nm. Also, it was confirmed that the defects near the surface were removed and that a high performance silicon (di)oxide film having a clean interface was formed. Here, only the 6H—SiC was described. However, it was confirmed that other SiCs such as 4H and 3C were also effective and that the surface was not limited to the (0001) face.

It was confirmed by ESR (electron spin resonance) measurement that the thus formed clean surface had a defect density of $1 \times 10^8$ cm$^{-2}$ or less.

EXAMPLE 2

Another example of the surface treatment method for silicon carbide according to the method for manufacturing a SiC device according to the present invention will be illustrated. As a first step, a 6H—SiC(0001) face:4-degree off Si face single crystal substrate was introduced into an ion implantation apparatus, and oxygen ions were implanted at an energy of 30 keV in a dose of $1\times10^{16}$. In the distribution of the oxygen implanted in the SiC crystal in this case, the peak position was at a depth of about 60 nm from the surface. Also the portion turned into an amorphous portion by the defects introduced by the ion implantation was at a depth of about 80 nm from the surface. In this case, the temperature of the substrate during oxygen implantation was maintained at 100° C. or lower. This implanted SiC substrate was taken out from the ion implantation apparatus and, as a second step, introduced into a normal wet oxidation apparatus to carry out an oxidation treatment in a wet oxygen atmosphere at 1100° C. for 1 hour in a manner similar to that of Example 1. The thus formed oxide film had a thickness of 150 nm, which was much larger than the 30 nm for the wet oxidation without ion implantation. The refractive index of this oxide film was measured by an ellipsometer. It was confirmed that the refractive index was 1.45 and that a high performance silicon (di)oxide film with a clean interface was formed. Here, the ion energy of 30 keV was described. However, an oxide film was effectively formed if the ion energy was within the range of the present invention. The dose and the temperature of SiC other than those of this example were also effective as long as they were within the range of the present invention. Furthermore, it was confirmed that an oxide film having a greater thickness, a thickness of 280 nm, was obtained by carrying out not only implantation at 30 keV but also that at 150 keV in a dose similar to that at 30 keV. Here, only the 6H—SiC was described. However, it was confirmed that other SiCs such as 4H and 3C were also effective and that the surface was not limited to the (0001) face. The thus formed oxide film was, as a third step, removed by a buffered hydrofluoric acid treatment, in which the oxide film was dissolved in a mixed solution of hydrofluoric acid and a 40 vol. % ammonium fluoride aqueous solution (for example, 1:6), to form a silicon carbide clean surface.

It was confirmed by ESR (electron spin resonance) measurement that the thus formed clean surface had a defect density of $1\times10^8$ cm$^{-2}$ or less.

EXAMPLE 3

An example of the surface treatment method for silicon carbide according to the method for manufacturing a SiC device according to the present invention will be illustrated. As a first step, a 6H—SiC(0001) face:4-degree off Si face single crystal substrate was introduced into an ion implantation apparatus, and neon ions were implanted at an energy of 30 keV in a dose of $5\times10^{16}$. The distribution of the neon implanted in the SiC crystal in this case was substantially the same as that of the oxygen in Example 2, and the peak position was at a depth of about 60 nm from the surface. Also, the portion turned into an amorphous portion by the defects introduced by the ion implantation was at a depth of about 90 nm from the surface. In this case, the temperature of the substrate during neon implantation was maintained at 100° C. or lower. This implanted SiC substrate was taken out from the ion implantation apparatus and, as a second step, introduced into a normal wet oxidation apparatus to carry out an oxidation treatment in a wet oxygen atmosphere at 1100° C. for 1 hour in a manner similar to that of Example 1. The thus formed oxide film had a thickness of 150 nm, which was much larger than the 30 nm for the wet oxidation without ion implantation. The refractive index of this oxide film was measured with an ellipsometer. It was confirmed that the refractive index was 1.45 and that a high performance silicon (di)oxide film with a clean interface was formed. These thickness and refractive index were substantially the same as those for the oxygen ion implantation in Example 1. Here, the ion energy of 30 keV was described. However, an oxide film was effectively formed if the ion energy was within the range of the present invention. The dose and the temperature of SiC other than those of this example were also effective as long as they were within the range of the present invention. Furthermore, it was confirmed that an oxide film having a greater thickness, a thickness of 280 nm, was obtained by carrying out not only implantation at 30 keV but also that at 150 keV. Here, only the 6H—SiC was described. However, it was confirmed that other SiCs such as 4H and 3C were also effective and that the surface was not limited to the (0001) face. The ions implanted in the first step were oxygen or neon in Examples 2–3. However, a good silicon (di)oxide thin film was also formed by using other ions, e.g. a substance such as silicon that is turned into an insulating material such as silicon (di)oxide by oxidation, a substance such as carbon that is turned into a gas such as carbon dioxide by oxidation, a substance that is a stable gas, such as nitrogen, argon, krypton, or xenon, and a substance such as hydrogen that is turned into water by oxidation and turned into a gas at high temperature. The thus formed oxide film was, as a third step, removed by a buffered hydrofluoric acid treatment similar to that in Example 2 to form a silicon carbide clean surface.

It was confirmed by ESR (electron spin resonance) measurement that the thus formed clean surface had a defect density of $1\times10^8$ cm$^{-2}$ or less.

EXAMPLE 4

Oxygen ions were implanted as described in Example 2 in a portion of a silicon carbide substrate (diameter: 30 mm) similar to that used in Example 2, while part of the ion beams was blocked using a metallic mask made of stainless steel. The portions where implantation was carried out at an energy of 30 keV and at an energy of 150 keV+30 keV were formed each with a size of 5 mm by 5 mm. The doses for ion implantation were $1\times10^{16}$ ions/cm$^2$ for the implantation at 30 keV and $1\times10^{16}$ ions/cm$^2$ at each energy for the multiple implantation at 150 keV+30 keV. The ion implanted silicon carbide substrate was subjected to an oxidation treatment similar to that in Example 2. A SiO$_2$ film was formed which had a thickness of 30 nm in the masked region that was not subjected to ion implantation, a thickness of 150 nm in the 30 keV ion implanted region, and a thickness of 280 nm in the 30 keV+150 keV ion implanted region. When the patterned oxide film was removed by a buffered hydrofluoric acid treatment similar to that in Example 2, silicon carbide clean surfaces were formed in the 5-mm-by-5-mm patterns at depths of 60 nm and 120 nm.

It was confirmed by ESR (electron spin resonance) measurement that the thus formed clean surface had a defect density of $1\times10^8$ cm$^{-2}$ or less.

It was confirmed that the defect density further decreased if this clean silicon carbide surface was subjected to the above oxidation treatment and the oxide film etching treatment again. The defect density further decreased if the above oxidation treatment and the oxide film etching treatment were repeated several times.

EXAMPLE 5

A silicon carbide surface was subjected to reactive ion etching in a CF$_4$+O2 atmosphere using an Al thin film as a mask to form a pattern. It was confirmed by ESR measurement that this surface had a defect density of $10^9$ cm$^{-2}$ or more. This surface was subjected to an oxidation treatment by a method similar to that illustrated in Example 1 to form an oxide film. This oxide film was removed by a buffered hydrofluoric acid treatment similar to that in Example 1. The defect density was $10^8$ cm$^{-2}$ or less.

In this case, it was also confirmed that with a silicon carbide surface on which a pattern was formed by reactive ion etching using other gases such as HF, ion milling with an inert gas such as Ar at several keV, plasma etching with a hydrogen chloride gas, laser etching using excimer lasers, mechanical cutting with a diamond saw or the like, or grinding using a diamond paste, the above silicon carbide clean surface was formed by the method for forming and etching a silicon (di)oxide film according to the present invention.

Furthermore, the above silicon carbide clean surface was also formed by forming a relatively thick oxide film by ion implantation similar to those in Example 2 or 3, to the silicon carbide surface, on which a pattern was formed by an etching treatment, and removing this oxide film.

The defect density further decreased if the above oxidation treatment and the oxide film etching treatment were repeated several times as in Example 4.

EXAMPLE 6

A Si(001) 4-degree-offcut in the [110] direction substrate was introduced into a MBE apparatus and heated to 900° C. or higher under a high vacuum of not more than $10^{-9}$ Torr to form a Si clean surface on which a Si(001)(2×1) surface reconstruction was observed by Reflective High Energy Electron Diffraction (RHEED).

The Si(001)2×1 clean surface was formed by heating the Si substrate under high vacuum here. However, it was confirmed that the cleaning was successively performed at a vacuum of not more than $10^{-6}$ Torr and/or in a hydrogen gas atmosphere under a lower vacuum. Under a vacuum poorer than this vacuum, SiC was formed in random directions on the Si surface before cleaning, so that heteroepitaxial growth was not carried out uniformly. Also, the cleaning was successively performed by irradiation with light having a wavelength of the ultraviolet light range, such as excimer lasers or deuterium lamp light, rather than heating. Also, a clean surface was formed by exposure to a reactive etching gas such as ozone and chlorine or chloride and fluorine or a fluoride gas, rather than under high vacuum.

After this clean surface was cooled to 400° C. or lower, the temperature was raised again at a temperature increase rate of 100° C. per minute. From the moment when the substrate temperature reached 400° C., carbon atoms were vaporized from an electron beam evaporater apparatus, in which a crucible filled with graphite chunks was irradiated by an electron gun, and molecular carbons (carbon clusters or carbon atoms) were supplied to the substrate surface to carry out the first step. In this case, the distance from the crucible to the substrate was about 40 cm, and the suitable power supply to the electron beam evaporater apparatus was about 8 kV and 100 mA. The carbon supplied to the substrate surface formed a carbon thin film until the Si substrate temperature reached 600° C. at which point the reaction between the Si substrate surface and carbon started. The carbon thin film formed on the Si substrate surface by the first step, had a thickness of about a 5-atomic layer.

In the first step of the present invention, the carbon supply started from at 400° C. while the temperature of the substrate rose, and a thin film containing carbon was formed while the temperature rose from 400° C. to 600° C. However, it was confirmed that the carbon thin film was also formed with the substrate temperature being constant or changed in the range of −195° C. to 600° C. and that such a temperature was effective. The temperature should be 600° C. or lower, and it is not limited to 400° C. in the first step. If carbon is supplied at a temperature of 600° C. or higher in the first step, pits are easily formed under the SiC/Si interface, so that crystal grains having different crystal directions grow easily.

Also, it was confirmed that if the formed carbon film was in the range of a 1- to 20-atomic layer, good crystalline silicon carbide was formed by carbonization in the second step. With a 1-atomic layer or less, the reaction was uniformless. With 20-atomic layers or more, the carbon thin film was very stable, so that the reaction did not easily occur in the second step. It was confirmed that the formed carbon thin film was also effective if it contained hydrogen, chlorine, or the like, other than carbon. In this case, the thin film containing carbon formed by the first step was an amorphous thin film. In the carbonization of the second step, the amorphous thin film was more reactive than crystalline thin films, so that SiC having few defects, that is a high performance carbonized layer, was efficiently formed.

In this example, the carbon was supplied from the electron beam evaporater apparatus in the form of an atom (a molecule) or a cluster, and therefore the supply was different from that of gaseous carbon. It was confirmed that if $1\times10^{-7}$ Torr or more of a gaseous carbon source such as $C_2H_4$ was supplied during the formation of the thin film of this example, the formation of single-phase 3C—SiC described in the example deteriorated, so that a number of twins were formed. This is probably because during the carbonization reaction in the second step, the reaction between the gas and the Si substrate surface selectively occurs at the steps of the Si substrate surface and/or the defects, so that the formed silicon carbide contains a number of lattice defects, twins, pits or the like. Thus, it was confirmed that, in order to implement the method for manufacturing a silicon carbide thin film according to the present invention, the supply of molecular beams of carbon rather than gaseous carbon was effective and it was effective to form a carbon thin film on a substrate surface maintained at low temperature in the first step. In this case, it was confirmed that a carbon thin film was also formed in the first step, with a carbon source in which a hydrocarbon gas was cracked using a filament and that such a carbon source was effective.

The substrate temperature was raised while the carbon was supplied, and the carbonization treatment of the second step was carried out under a temperature of 800° C. or more. In this case, it was confirmed that the SiC crystal grains formed in the carbonization process had the same crystal direction. This is because a number of terraces and steps are present in the offcut substrate surface, so that the surface reactivity is different between in the P direction of the long atomic rows parallel to step edges and in the N direction (shown in FIG. 4) of the short atomic rows, on the terraces, perpendicular to the step edges and parted by the step edges on the off cut Si(001) substrate surface. In other words, it is believed that since the basic mechanism of the carbonization is a solid phase reaction between the carbon thin film having a several-atomic layer and the Si(001) surface causing Si [110] and carbon to shrink, shorter Si [110] atomic rows can shrink more easily to form a uniform 3C—SiC(001)/Si(001) interface. In the above offcut substrate surface, the shrinkage of the Si [110] atomic rows occurs more easily in the N direction (shown in FIG. 4), and the Si(lower portion)C (upper portion) direction of the [110] of the 3C—SiC crystal is equal to the N direction.

In the second step, it was confirmed that carbonization occurred if the temperature of the Si substrate was raised in the range of 800° C. to the melting point of Si. Also, it was confirmed that if the temperature increase rate was in the range of 20° C./minute to 500° C./minute between 600° C. and 1000° C. at which carbonization proceeds, heteroepitaxial silicon carbide was formed on the Si substrate surface. At a temperature increase rate higher than this range, it was difficult to raise the temperature of the substrate uniformly. At a temperature increase rate lower than this range, the uniformity of the interface degraded. If the first and second steps described so far were carried out under a high vacuum of not more than $10^{-7}$ Torr, twin occurrence was inhibited, and such processes were effective.

From the moment the substrate temperature reached 1050° C., silicon was supplied from a Knudsen cell in addition to carbon to carry out the third step. In this case, the temperature of the Si Knudsen cell was maintained at 1357° C. The crystallinity of the substrate surface was constantly monitored by RHEED in the growth chamber of the MBE to carry out in-situ analysis. The amount of C/Si supplied to the 3C—SiC(001) growth surface was controlled so that the 3C—SiC(001) surface constantly maintained a stable (3×2) surface reconstruction structure (surface-structure-controlled growth). The 3C—SiC(001)(3×2) surface has a structure in which excess Si atoms are added to the Si-terminated surface. In the growth of the 3C—SiC(001) surface by this surface-structure-controlled growth, Si atoms are supplied from the surface having excessive Si constantly, so that the growth in the Si(upper portion)C(lower portion) direction selectively occurs and the crystal grains grow longer in this direction. If the selective growth direction of the crystal grains is equal to the long P direction on the terraces of the off-cut substrate surface, the growth of the crystal grains proceeds on the terraces without being disturbed by the steps, so that the growth of a single-phase 3C—SiC single crystal is easily proceeded. On the other hand, in the anti-phase domain in the position forming an angle of 90 degrees with respect to the above crystal direction, the selective growth direction is in the N direction, so that the growth is constantly inhibited by the steps. It is believed that when two types of the above anti-phase domains grow, the crystal grains, whose selective growth direction is equal to the P direction, selectively grow, and the anti-phase domain disappears from the growing surface after long-time growth. The above crystal direction of the 3C—SiC formed by carbonization of the off-cut surface was in the Si(lower portion)C(upper portion)//N direction. This crystal direction is equal to the Si(upper portion)C(lower portion)//P direction considering the selective growth on the terraces. In other words, if the above carbonization treatment and the surface-structure-controlled growth are carried out, the 3C—SiC single crystal having the same azimuth selectively grows, and the growth of other anti-phase domains is inhibited. If the 3C—SiC single crystal having a certain thickness is grown, a single-phase 3C—SiC single crystal thin film is obtained.

Figure 9:
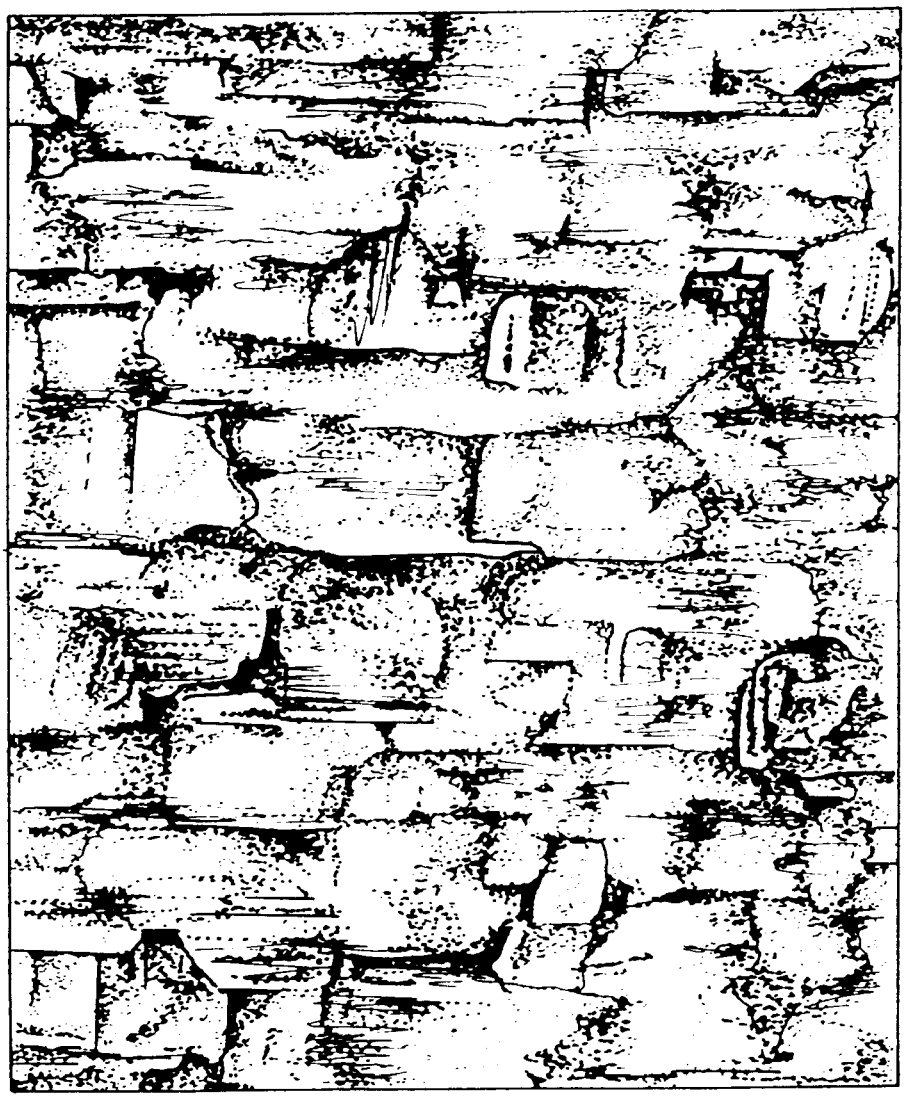
FIG. 9 is a traced drawing of a scanning electron microscope (SEM) photograph of a 3C—SiC(001) surface formed by a method for growing SiC in Example 6 of the present invention.

FIG. 9 shows a tracing of a scanning electron microscope (SEM) photograph of a single-phase 3C—SiC(001) surface having a thickness of 100 nm subjected to the above surface control growth for 3 hours. It can be observed that crystal grains having the same azimuth selectively grow on the terraces to proceed coalescence to form a large single crystal. The observed crystal grains had a size of about 100 nm with respect to the thickness of 100 nm. If the growth of this thin film further continued, these crystal grains became further coalesce to form large single crystal grains.

Figure 10:
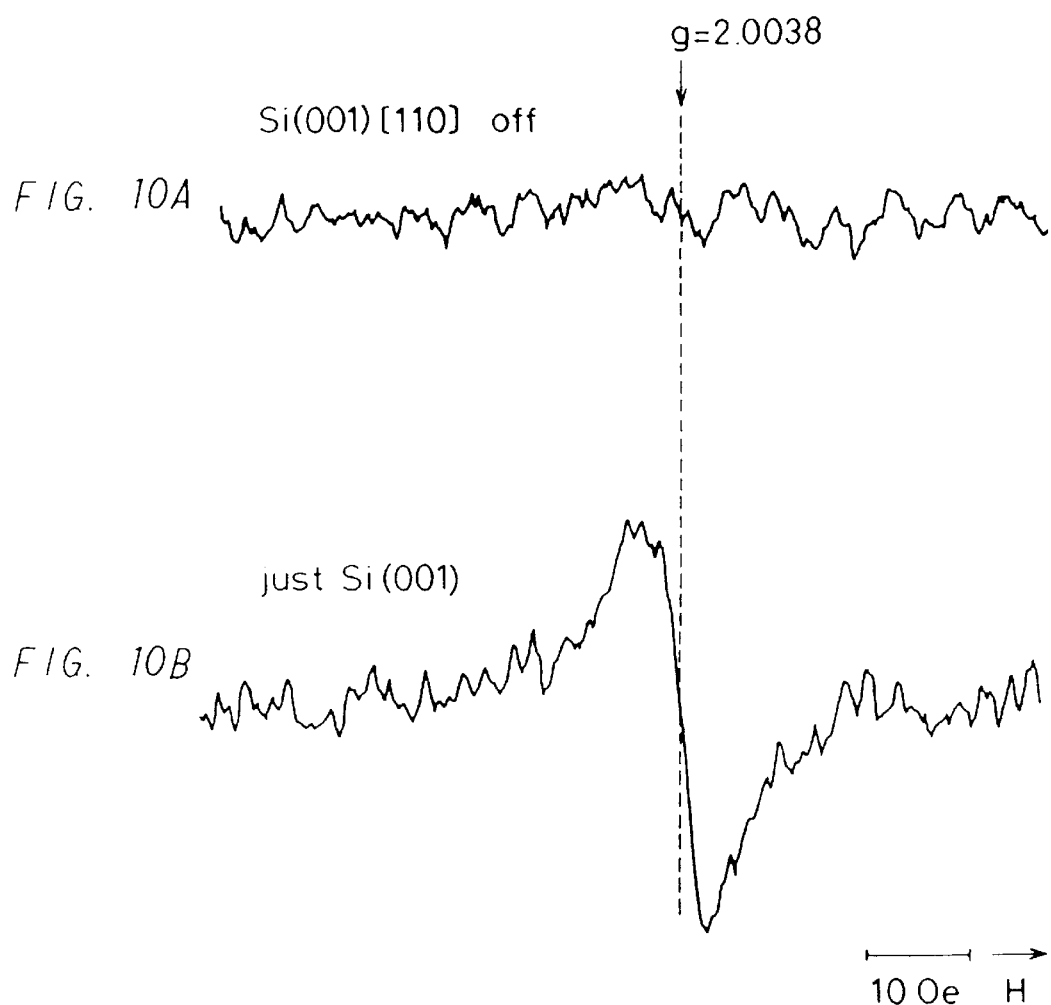
FIG. 10A shows an electron spin resonance (ESR) spectrum for a single-phase 3C—SiC single crystal thin film formed by the method for growing SiC in Example 6 of the present invention.
FIG. 10B shows an ESR spectrum for a silicon carbide thin film formed by a comparative example (carbonization reaction caused by the reaction between a gas and a Si substrate surface).

FIG. 10A shows an ESR spectrum from a single-phase 3C—SiC single crystal thin film having a thickness of 100 nm grown by the method for forming a silicon carbide thin film according to the present invention. FIG. 10B shows an ESR spectrum for a silicon carbide thin film formed by another method (carbonization reaction caused by the reaction between a hydrocarbon gas and a Si substrate surface) for comparison. The spectrum of Si dangling bonds corresponding to the lattice defects observed in FIG. 10B was not observed in FIG. 10A formed by the method for manufacturing a silicon carbide thin film according to the present invention, and it was confirmed that the lattice defects in the thin film were remarkably decreased.

In this example, the off-cut substrate was used as the Si(001) substrate having anisotropy. However, a just-cut substrate having a surface to which pattern is provided by anisotropic etching may be used if its surface has anisotropy and comprises terraces and steps. The direction for the off-cut is not limited to the [110] direction. The substrate off-cut in any direction may be used if the length (width) of the terrace in the [110] direction and that in the [110] direction (forming an angle of 90 degrees with respect to the [110] direction) are not equal and are anisotropic. In order to fully ensure the anisotropy to form single-phase SiC efficiently, the direction of the step edges of the Si surface preferably forms an angle in the range of 0 to 30 degrees with respect to the Si <110> direction.

In this example, the angle of the off-cut was 4 degrees, and the width of the terrace was about 2 nm. However, a good single-phase 3C—SiC single crystal thin film was also obtained if the angle of the off-cut was varied to change the width of the terrace in the range of 0.5 nm to 100 nm. With a terrace width of less than 0.5 nm, a number of twins were formed by carbonization, so that a single-phase single crystal thin film was not formed. Also, with a terrace width of more than 100 nm, the anisotropy did not act effectively in the carbonization mechanism, so that a two-phase thin film comprising an anti-phase boundary (APB) was formed.

In this example, the 3C—SiC(001) surface had a (3×2) surface reconstruction and maintained an excess Si surface in which additional Si was present on the Si terminate (001) surface for growth in the process for supplying carbon and silicon after carbonization to grow SiC(001). The present invention was also effective when the growth was carried out so that the surface rearrangement maintained other reconstruction structures (5×2), (7×2), . . . (2n+1,2)(n is a positive integer). Also, the present invention was effective with the (2×1) surface, that is the Si terminate 3C—SiC (001) surface. The suitable Si/C abundance ratio of the excess Si surface is in the range of 1 to 2. If the Si/C ratio was 2 or more, the crystal grains of Si deposited on the SiC surface to inhibit the growth of SiC, so that SiC having good crystallinity was not grown.

In this example, the Si(001) surface was described. However, the inventor confirmed that the above method for growing SiC according to the present invention was also effective for other surfaces of the Si substrate, such as a Si(111) face. The process for forming a thin film containing carbon in the first step, the cleaning of the Si substrate, and the use of the Si substrate having anisotropy were similar to those of the method for growing a 3C—SiC (001) face. For controlling the Si/C ratio during growth, an excess C surface was suitable for the growth of the 3C—SiC(111), contrary to the 3C—SiC(001). With excess Si, a 3C—SiC(001) facet appeared on the 3C—SiC(111) surface, so that the roughness of the surface was perceived, and Si crystal grains grew in some cases. The suitable Si/C ratio was in the range of 1 to 0.5. In a Si/C ratio of 0.5 or less, the roughness of the surface of the 3C—SiC(111) film was perceived. The inventor confirmed that the optimal conditions for growing the 3C—SiC(111) face and an α-SiC(0001) surface were substantially the same. In other words, the excess C surface is suitable for growing the α-SiC(0001) surface. Out of the optimal conditions, problems similar to those of the 3C—SiC(111) occurred.

EXAMPLE 7

After a silicon carbide thin film having a thickness of 100 nm was formed on a Si substrate according to Example 6, the substrate was introduced into a CVD apparatus to grow silicon carbide at high speed. The substrate was heated to 1300° C. by induction heating. A hydrogen gas was supplied as the carrier gas at a flow rate of 2 slm, and a silane gas and a propane gas were supplied at 1 sccm and 0.4 sccm respectively. The growth chamber was subjected to vacuum by a rotary pump and maintained at about 100 Torr. By carrying out growth under the conditions for 5 hours, a low defect silicon carbide thin film having a thickness of 12 microns grew. This example comprises carrying out at least the first and second steps with a MBE apparatus under high vacuum and carrying out the third step or a part of the third step with a CVD apparatus, and is suitable for growing a thick heteroepitaxial film for electronic devices.

EXAMPLE 8

Figure 11:
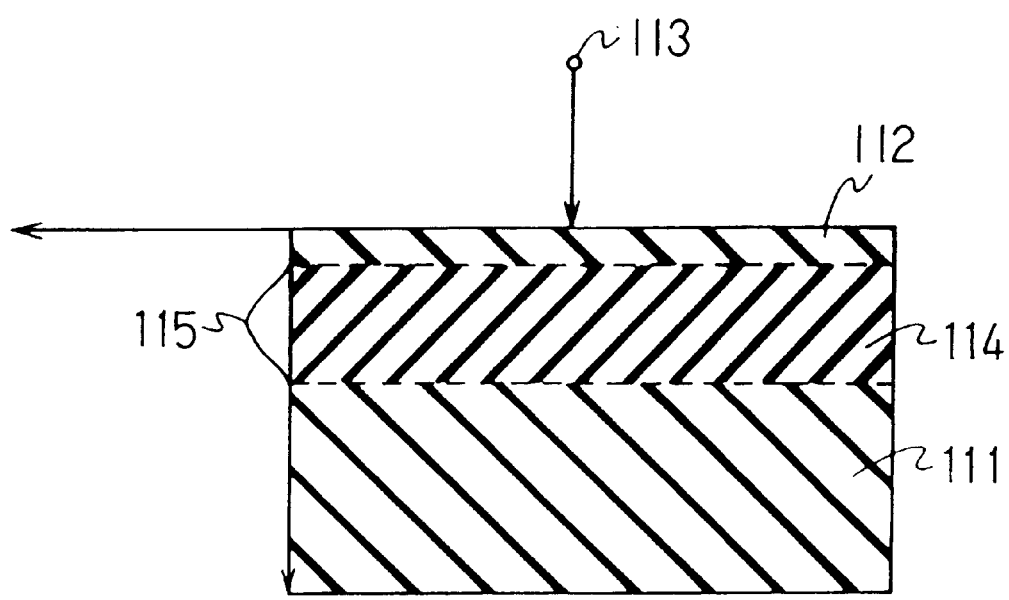
FIG. 11 shows a method for forming a silicon (di)oxide insulating film according to a method for manufacturing a SiC device in Example 8 of the present invention.

In this example, a SiC surface treatment method for making a silicon (di)oxide film according to the method for manufacturing a SiC device will be described. A 6H—SiC (0001) face:4-degree off Si face single crystal substrate was introduced into an ion implantation apparatus, and oxygen ions were implanted at an energy of 30 keV in a dose of $1 \times 10^{16}$ cm$^{-2}$. The distribution of the oxygen implanted in a SiC crystal 111 in this case was as shown in FIG. 11, and a peak position 115 was at a depth of about 60 nm from a surface 112. Also, the portion 114, turned amorphous by the defects introduced by ion 113 implantation, was at a depth about 80 nm from the surface. In this case, the temperature of the substrate during oxygen implantation was maintained at 100° C. or lower. This implanted SiC substrate was removed from the ion implantation apparatus and introduced into a normal wet oxidation apparatus to carry out an oxidation treatment in a wet oxygen atmosphere at 1100° C. for 1 hour. The thus formed oxide film had a thickness of 150 nm, which was much larger than 30 nm for the wet oxidation without ion implantation. The refractive index of this oxide film was measured by an ellipsometer. It was confirmed that the refractive index was 1.45 and that a high performance silicon (di)oxide film with a clean interface was formed. Here, the ion energy of 30 keV was described. However, an oxide film was effectively formed if the ion energy was within the range of the present application. The dose and the temperature of SiC other than those of this example were also effective as long as they were within the range of the present invention. Furthermore, it was confirmed that an oxide film having a greater thickness, a thickness of 280 nm, was obtained by carrying out not only implantation at 30 keV but also that at 150 keV. Here, only the 6H—SiC was described. However, it was confirmed that other SiCs such as 4H and 3C were also effective and that the surface was not limited to the (0001) face.

EXAMPLE 9

In this example, another SiC surface treatment method for making silicon (di)oxide film according to the method for manufacturing a SiC device will be described. A 6H—SiC (0001) face:4-degree off Si face single crystal substrate was introduced into an ion implantation apparatus, and neon ions were implanted at an energy of 30 keV in a dose of $5 \times 10^{16}$ cm$^{-2}$. The distribution of the neon implanted in the SiC crystal in this case was substantially the same as that of the oxygen in Example 8, and the peak position was at a depth of about 60 nm from the surface. Also, the portion turned into an amorphous portion by the defects introduced by the ion implantation was at a depth about 90 nm from the surface. In this case, the temperature of the substrate during oxygen implantation was maintained at 100° C. or lower. This implanted SiC substrate was taken off from the ion implantation apparatus and introduced into a normal wet oxidation apparatus to carry out an oxidation treatment in a wet oxygen atmosphere at 1100° C. for 1 hour. The thus formed oxide film had a thickness of 150 nm, which was much larger than 30 nm for the wet oxidation without ion implantation. The refractive index of this oxide film was measured with an ellipsometer. It was confirmed that the refractive index was 1.45 and that a high performance silicon (di)oxide film having a clean interface was formed. These thickness and refractive index were substantially the same as those for the oxygen ion implantation in Example 8. Here, the ion energy of 30 keV was described. However, an oxide film was effectively formed if the ion energy was within the range of the present invention. The dose and the temperature of SiC other than those of this example were also effective as long as they are within the range of the present invention. Furthermore, it was confirmed that an oxide film having a greater thickness, a thickness of 280 nm, was obtained by carrying out not only implantation at 30 keV but also at 150 keV. Here, only the 6H—SiC was described. However, it was confirmed that other SiCs such as 4H and 3C were also effective and that the surface was not limited to the (0001) face. The ions implanted in the first step were oxygen or neon in Examples 8 and 9. However, a good silicon (di)oxide thin film was also formed by using other ions, e.g. a substance such as silicon that is turned into an insulating material such as silicon (di)oxide by oxidation, a substance such as carbon that is turned into a gas such as carbon dioxide by oxidation, a substance that is a stable gas, such as nitrogen, argon, krypton, or xenon, and a substance such as hydrogen that is turned into water by oxidation and turned into a gas at high temperature.

EXAMPLE 10

A Si(001) 4-degree-offcut in the [110] direction substrate of n-type Si having a resistivity of 10 Ω•cm was introduced into a MBE apparatus and heated to 900° C. or more under a high vacuum of not more than 10-8 Torr to form a Si clean surface on which a Si(001)(2×1) surface reconstruction was observed by RHEED. After this clean surface was cooled to 400° C. or lower, the temperature was raised again at a temperature increase rate of 100° C. per minute. From the moment when the substrate temperature reached 400° C., carbon atoms were vaporized from an electron beam evaporater apparatus in which a crucible filled with graphite chunks was irradiated by an electron gun and supplied to the substrate surface. In this case, the distance from the crucible to the substrate was about 40 cm, and the suitable power supply to the electron beam vapor deposition apparatus was about 8 kV and 100 mA. The substrate temperature was raised while the carbon was supplied, and the carbonization treatment was carried out in the process of a temperature increase of 800° C. or more. In this case, it was confirmed that the SiC crystal grains formed in the carbonization process had the same crystal direction. This is because a number of terraces and steps are present in the offcut substrate surface, so that the surface reactivity is different between in the P direction of the long atomic rows parallel to the step edges and in the N direction of the short atomic rows, on the terraces, perpendicular to the step edges and parted by the step edges.

It is believed that as the basic mechanism of the carbonization is that a solid phase reaction between the carbon thin film having a several-atomic layer and the Si(001) surface causes Si [110] and carbon to shrink, shorter Si [110] atomic rows can shrink more easily to form a uniform 3C—SiC (001)/Si(001) interface. In the above offcut substrate surface, the shrinkage of the Si [110] atomic rows occurs more easily in the N direction, and the Si(lower portion)C (upper portion) direction of the [110] of the 3C—SiC crystal is equal to the N direction.

From the moment the substrate temperature reached 1050° C., silicon was supplied from a Knudsen cell in addition to carbon. In this case, the temperature of the Si Knudesen cell was maintained at 1357° C. The crystallinity of the substrate surface was constantly observed by RHEED in the growth chamber of the MBE to carry out in-situ analysis. The amount of C/Si supplied to the 3C—SiC(001) growth surface was controlled so that the 3C—SiC(001) surface constantly maintained a stable (3×2) surface rearrangement structure (surface control growth). The 3C—SiC (001)(3×2) surface has a structure in which excess Si atoms are added to the Si-terminated surface and has excess Si compared with the structure of SiC with C/Si=1. In the growth of the 3C—SiC(001) surface by this surface control growth, Si atoms are supplied from the surface having excess Si constantly, so that the growth in the Si(upper portion)C(lower portion) direction selectively occurs. If the direction is equal to the P direction, the growth of the crystal grains proceeds on the terraces without being disturbed by the steps, so that the growth of a single-phase 3C—SiC single crystal is easily obtained. On the other hand, in the anti-phase domain in the position forming an angle of 90 degrees with respect to the above crystal direction, the selective growth direction is in the N direction, so that the growth is constantly inhibited by the steps. It is believed that when two types of the above anti-phase domains grow, the crystal grains whose selective growth direction is equal to the P direction selectively grow, and the other anti-phase domain disappears after long-time growth. The above crystal direction of the 3C—SiC formed by carbonization of the off-cut surface was in the Si(lower portion)C(upper portion)//N direction. This crystal direction is equal to the Si(upper portion)C(lower portion)//P direction considering the selective growth on the terraces. In other words, if the above carbonization treatment and the surface control growth were carried out, the 3C—SiC single crystal having the same azimuth selectively grows, and the growth of other anti-phase domains was inhibited. If the 3C—SiC single crystal having a certain thickness (20 nm or more) were grown, a single-phase 3C—SiC single crystal thin film was obtained. In this case, an n-type Si substrate was used. By introducing nitrogen into the growth chamber so that the vacuum was $10^{-8}$ Torr or more for further growing the above SiC, N was doped to make the SiC thin film of n-type as well.

This single-phase silicon carbide film was further grown by the CVD method to form silicon carbide having a thickness of 30 microns on the Si substrate. In this case, a hydrogen gas, a silane gas, and a propane gas were introduced into the CVD growth chamber at 2 LM, 1 sccm, and 0.4 sccm respectively. The crystal growth was performed at a reduced pressure of about 100 Torr, with these gases being sucked by a rotary pump. The substrate was put on a susceptor of graphite and heated to about 1300° C. by induction heating at a high-frequency of 20 kHz. By also introducing a nitrogen gas at about 1 sccm during growth, the growing silicon carbide became an n-type semiconductor.

Figure 12:
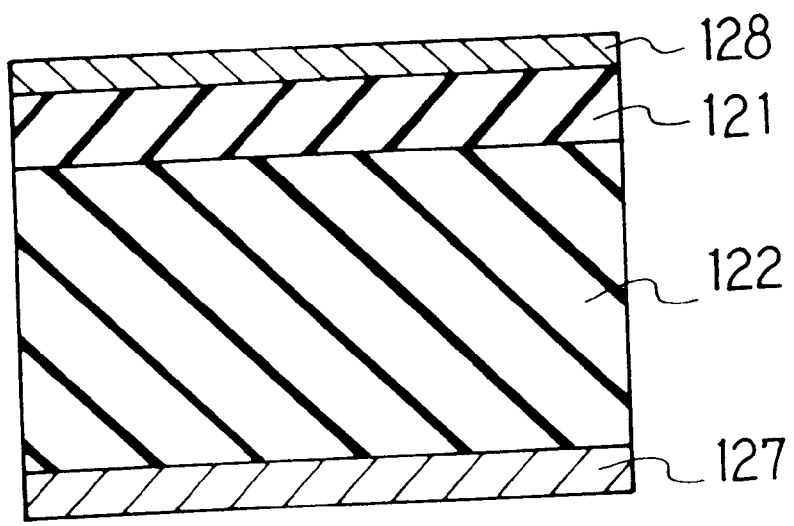
FIG. 12 shows an ohmic characteristic evaluation device of a silicon carbide semiconductor device in Example 10 of the present invention.
Figure 13:
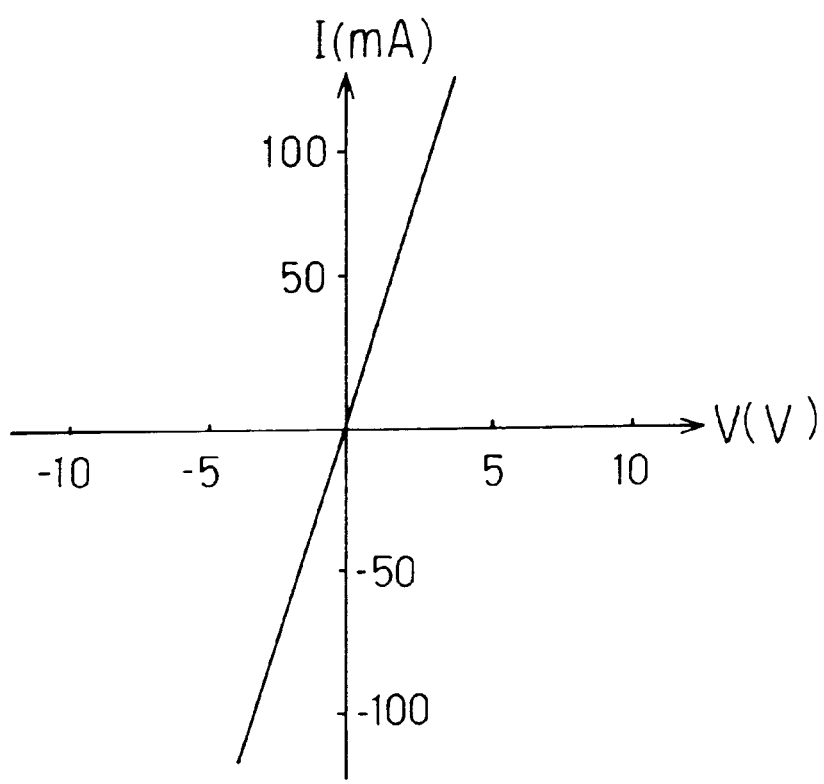
FIG. 13 shows the I–V characteristics of an n-type SiC/n-type Si layered structure in Example 10 of the present invention.

As shown in FIG. 12, the surface on the SiC 121 side of the n-SiC/n-Si layered structure formed as described above was subjected to electron beam vapor deposition of Ni and heat treatment at 900° C. in an Ar atmosphere to form an electrode 128. In this case, a Si substrate 122 had a thickness of 0.5 mm, and the SiC thin film 121 had a thickness of 30 microns. Also, an AlSi electrode 127 was formed on the back surface on the Si side by a sputtering deposition method to form the electrode on the Si side. These electrodes were ohmically connected to Si and SiC respectively. Voltage was applied to the electrodes 127 and 128 on the above Si and SiC sides to measure the I–V characteristics. Linear characteristics that do not have polarity as shown in FIG. 13 were observed. This shows that the conductors at the SiC/Si interface were smoothly connected without discontinuity. The current flowing across this SiC/Si interface does not feel the interface and feels only a simple electric resistance of the current path. In this example, the resistivity of the Si substrate was $10^2$ Ω•cm. However, in the range of $10^2$ Ω•cm or less, good I–V characteristics were observed. For other SiC/Si interface combinations, n-SiC/p-Si, p-SiC/n-Si, and p-SiC/p-Si, the I–V characteristics of the above SiC/Si had polarity, and the discontinuity of the band at the interface was confirmed.

EXAMPLE 11

Figure 14:
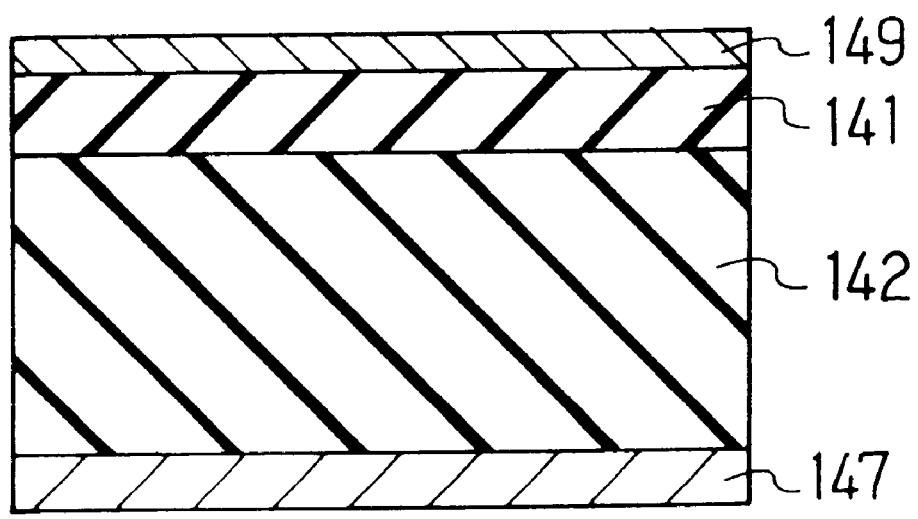
FIG. 14 shows the basic structure of a Schottky diode in Example 11 of the present invention.
Figure 15:
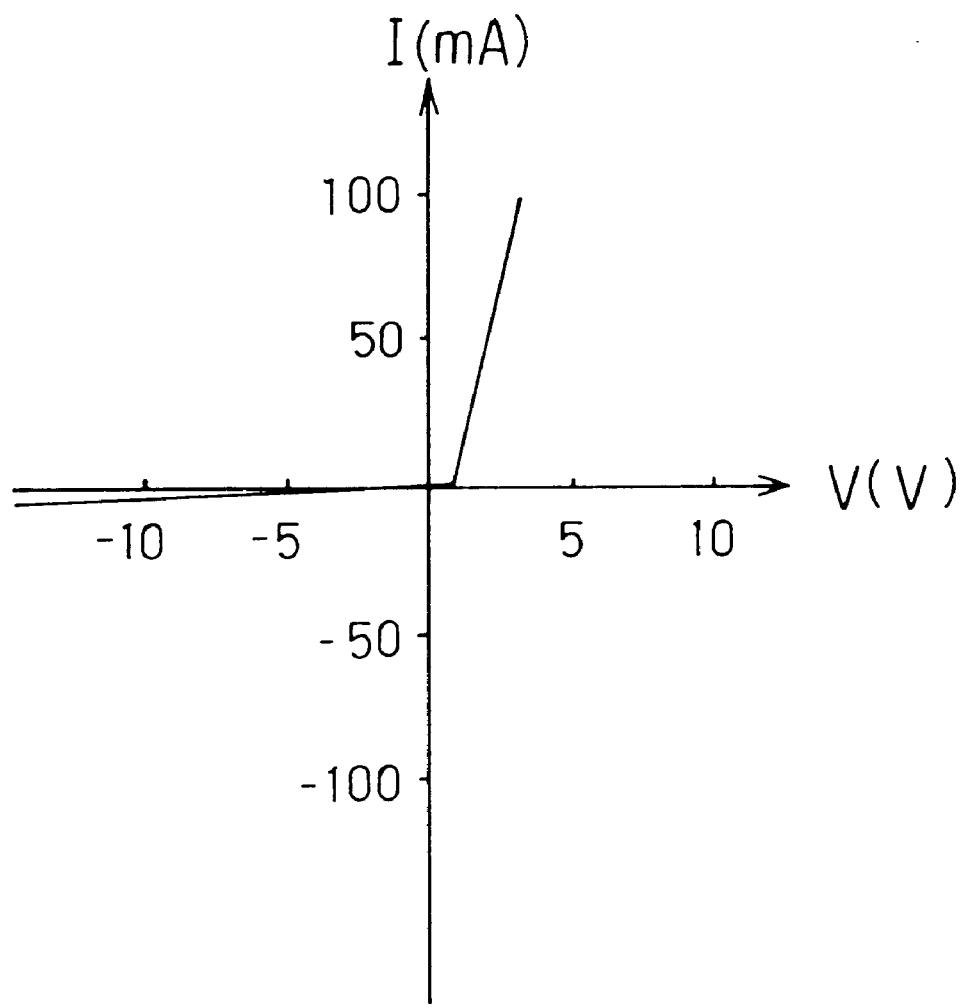
FIG. 15 shows the current (I)-voltage (V) characteristics of the Schottky diode in Example 11 of the present invention.

An n-SiC/n-Si layered structure was formed in a manner similar to that of Example 10. Only this layered structure had low resistance I–V characteristics. It was confirmed that in a Schottky diode in which a gold Schottky electrode 149 was formed on a SiC 141 surface by an electric resistance heating vapor deposition method, when current flowed in a direction across the SiC/Si interface, forward direction voltage drop or the like did not occur at the interface, resulting in an ideal low resistance. The other electrode is the same as that in Example 10. FIG. 15 shows the I–V characteristics of the Schottky diode of Example 11 shown in FIG. 14. The resistance in the forward direction was minimal compared with other structures such as p-SiC/p-Si.

As described above, according to the present invention, a method for manufacturing a device and a single crystal thin film of silicon carbide (SiC), which are wide band gap semiconductor materials and can be applied to semiconductor devices such as high power devices, high temperature devices, and environmentally resistant devices, can be provided. More particularly, the present invention can provide a method for forming an insulating film and a method for forming a clean surface in application for an electronic device such as a semiconductor device or a sensor using silicon carbide (SiC), a method for forming a surface structure having a trench structure or the like, and a SiC device having the formed low defect surface. Furthermore, the present invention can provide a method for forming a single-phase 3C—SiC single crystal thin film having a few crystal defects on a Si wafer by heteroepitaxial growth on the Si substrate surface.

What is claimed is:

1. A method for manufacturing a SiC device comprising a step for heating a silicon carbide crystal in an oxygen atmosphere to form a silicon (di)oxide thin film on a silicon carbide crystal surface, and a step for removing the silicon (di)oxide thin film formed on the silicon carbide crystal surface by etching to expose a clean surface of the SiC.

2. The method according to claim 1, comprising a first step for implanting ions to at least a part of a surface of a SiC silicon carbide crystal to introduce crystal defects near the SiC crystal surface to form an amorphous layer, a second step for heating the SiC crystal, to which the ions are implanted and the defects are introduced and which contains the amorphous layer, in an oxygen atmosphere to form a silicon (di)oxide thin film on the SiC crystal surface, and a third step for etching the silicon (di)oxide thin film formed on the SiC crystal surface.

3. The method according to claim 2, wherein the ion implanted to the SiC surface in the first step is at least one gas selected from the group consisting of oxygen, silicon, carbon, an inert gas, nitrogen, and hydrogen.

4. The method according to claim 2, wherein a dose of the ions implanted to the SiC surface in the first step is $10^{14}$ ions/cm$^2$ or more.

5. The method according to claim 2, wherein an energy of the ions implanted to the SiC surface in the first step is 1 keV to 10 MeV.

6. The method according to claim 2, wherein two or more energies of the ions implanted to the SiC surface in the first step are selected for multiple implantation.

7. The method according to claim 2, wherein a temperature of the SiC is maintained at 500° C. or lower when implanting ions to the SiC surface in the first step.

8. The method according to claim 2, wherein a part of the SiC surface is masked and a portion where ions are implanted is patterned when ions are implanted to the SiC surface in the first step.

9. The method according to claim 2, wherein at least one factor selected from the group consisting of an energy of the implanted ions, ion species, and ion density is different depending on a place on the SiC surface and patterning is performed when ions are implanted to the SiC surface in the first step.

10. The method according to claim 1, wherein a silicon carbide surface on which patterned steps and terraces are formed by an etching treatment is heated in an oxygen atmosphere to form a silicon (di)oxide thin film on the silicon carbide crystal surface, and the defects introduced by the etching treatment are removed by further etching the silicon (di)oxide thin film formed on the silicon carbide crystal surface.

11. The method according to claim 10, wherein the etching treatment is performed by at least one method selected from the group consisting of reactive ion etching, ion milling, plasma etching, laser etching, mechanical cutting, and mechanical grinding.

12. The method according to claim 1, comprising a first step for supplying carbon to a Si substrate surface maintained at low temperature to form a thin film containing carbon on the Si substrate surface, a second step for heating the Si substrate surface to cause a solid phase reaction between the Si substrate and the thin film containing carbon to carbonize the Si substrate surface to form silicon carbide, and a third step for supplying carbon and silicon after carbonization to grow silicon carbide so as to obtain a silicon carbide crystal film on the Si substrate.

13. The method according to claim 12, wherein the Si substrate surface is maintained in a temperature range of a liquid nitrogen temperature, −195° C., to 600° C. when the thin film containing carbon is deposited on the Si substrate surface in the first step.

14. The method according to claim 12, wherein the thin film formed on the Si substrate surface by the first step contains carbon corresponding to a thickness of a 1-atomic layer to 20-atomic layers.

15. The method according to claim 12, wherein the thin film formed on the Si substrate surface by the first step is an amorphous thin film containing carbon.

16. The method according to claim 12, wherein a substance containing carbon supplied to the Si substrate surface in the first step contains at least molecular carbon.

17. The method according to claim 12, wherein the Si substrate surface is heated to a temperature range of 800° C. to 1414° C., the melting point of Si, in the second step.

18. The method according to claim 12, wherein a temperature increase rate between 600° C. and 1000° C. is 20° C./min. to 500° C./min. when heating the Si substrate surface in the second step.

19. The method according to claim 12, wherein at least the first and the second steps are carried out under a vacuum of not more than $10^{-7}$ Torr.

20. The method according to claim 12, wherein at least the first and second steps are carried out by a molecular beam epitaxy (MBE) process under vacuum, and the third step or a part of the third step is carried out by a chemical vapor deposition (CVD) process providing a fast growth rate.

21. The method according to claim 12, comprising a step for removing an oxide film from the Si substrate surface to clean the surface before supplying carbon.

22. The method according to claim 21, wherein the cleaned Si surface has a Si(001)2×1 surface reconstruction structure.

23. The method according to claim 21, wherein the step for cleaning the Si substrate surface comprises a step of heating to 800° C. or higher under a vacuum of not more than $10^{-6}$ Torr or in a hydrogen atmosphere.

24. The method according to claim 21, wherein the step for cleaning the Si substrate surface comprises a step of irradiating the substrate surface with ultraviolet rays.

25. The method according to claim 21, wherein the step for cleaning the Si substrate surface comprises a step of exposing the Si substrate surface to at least one reactive etching gas selected from the group consisting of ozone and chlorine, chloride and fluorine, and fluoride gases.

26. The method according to claim 12, wherein an abundance ratio of carbon to silicon on the silicon carbide surface is controlled so that silicon atoms are always in excess of carbon atoms on the surface for growing silicon carbide when silicon and carbon are supplied to the surface of the SiC to grow 3C—SiC having a (001) face in the third step.

27. The method according to claim 26, wherein the abundance ratio of carbon to silicon on the silicon carbide surface is controlled so that the (001) growth surface of the 3C—SiC has at least one surface reconstruction selected from the group consisting of 3×2 and 5×2.

28. The method according to claim 26, wherein the abundance ratio of carbon to silicon on the silicon carbide surface is controlled so that the abundance ratio of silicon atoms to carbon atoms on the (001) growth surface of the 3C—SiC is greater than 1 and equal to or less than 2, in an excess silicon state.

29. The method according to claim 26, wherein a measuring means that can evaluate the surface structure of silicon carbide during growth is provided in a SiC formation apparatus to monitor the 3×2 or 5×2 structure of the 3C—SiC(001) surface, and an apparatus having a mechanism for controlling the abundance ratio of carbon to silicon on the SiC surface is used so that a 3×2 period or a 5×2 period is constantly observed when silicon and carbon are supplied to the surface of the SiC to form a 3C—SiC thin film having a (001) face.

30. The method according to claim 12, wherein an abundance ratio of carbon to silicon on the silicon carbide surface is controlled so that carbon atoms are in excess of silicon atoms on the SiC growth surface when silicon and carbon are supplied to the surface of the SiC to form 3C—SiC having a (111) face or an α-SiC thin film having a (0001) face in the third step.

31. The method according to claim 30, wherein the abundance ratio of carbon to silicon on the SiC surface is controlled so that the ratio of silicon atoms to carbon atoms on the (111) growth surface of the 3C—SiC or the (0001) growth surface of the α-SiC is 0.5 to 1, in an excess carbon state.

32. The method according to claim 30, wherein a measuring means that can evaluate the surface structure of silicon carbide during growth is provided in a SiC formation apparatus to observe the state of the 3C—SiC(111) surface in-situ, and an apparatus having a mechanism for controlling the abundance ratio of carbon to silicon on the SiC surface and inhibiting the growth of a crystal other than SiC is used when silicon and carbon are supplied to the surface of the SiC to form a 3C—SiC thin film having a (111) face or an α-SiC thin film having a (0001) face.

33. The method according to claim 12, wherein a Si substrate surface used for growing a silicon carbide thin film on the Si substrate surface is a miscut face of Si(001), an angle formed by a direction of step edges caused by miscut and a Si <110> crystal axis direction is 0 to 30 degrees, and the Si substrate surface has anisotropy and comprises terraces and steps.

34. The method according to claim 33, wherein a width of the terrace of the Si substrate surface is 0.5 nm to 100 nm.

35. The method according to claim 33, wherein pattern is formed by an etching treatment on the Si substrate surface to introduce terraces and steps having anisotropy.

36. The method according to claim 33, wherein an abundance ratio of carbon to silicon on the silicon carbide surface is controlled so that silicon atoms are always in excess of carbon atoms on the surface for growing silicon carbide when silicon and carbon are supplied to the SiC surface to grow 3C—SiC having a (001) face.

37. The method according to claim 36, wherein the abundance ratio of carbon to silicon on the silicon carbide surface is controlled so that the 3C—SiC(001) growth surface has at least one surface rearrangement selected from the group consisting of 3×2 and 5×2.

38. The method according to claim 37, wherein a measuring means that can evaluate the surface structure of silicon carbide during growth is provided in a SiC formation apparatus to monitor the 3×2 or 5×2 structure of the 3C—SiC(001) surface, and an apparatus having a mechanism for controlling the abundance ratio of carbon to silicon on the SiC surface is used so that a 3×2 period or a 5×2 period is constantly observed when silicon and carbon are supplied to the surface of the SiC to form a 3C—SiC thin film having a (001) face.

39. The method according to claim 36, wherein the abundance ratio of carbon to silicon on the silicon carbide surface is controlled so that the abundance ratio of silicon atoms to carbon atoms on the 3C—SiC(001) growth surface is greater than 1 and equal to or less than 2, in an excess silicon state.

40. The method according to claim 1, comprising after cleaning of SiC surface, and the formation and etching of silicon (di)oxide thin film on SiC, a first step for implanting ions to a surface of a SiC silicon carbide crystal to introduce crystal defects in the silicon carbide crystal and a second step for heating the silicon carbide crystal substrate, to which the ions are implanted and the defects are introduced, in an oxygen atmosphere to form a silicon (di)oxide thin film.

41. The method according to claim 40, wherein the ion implanted to the SiC surface in the first step is at least one ion selected from the group consisting of oxygen, silicon, carbon, an inert gas, nitrogen, and hydrogen.

42. The method according to claim 40, wherein a dose of the ions implanted in the SiC surface in the first step is $10^{14}$ ions/cm$^2$ or more.

43. The method according to claim 40, wherein an energy of the ions implanted in the SiC surface in the first step is 1 keV to 10 MeV.

44. The method according to claim 40, wherein two or more energies of the ions implanted in the SiC surface in the first step are selected for multiple implantation.

45. The method according to claim 40, wherein the SiC is maintained at 500° C. or lower when implanting ions in the SiC surface in the first step.

46. The method according to claim 40, wherein an amorphous layer is formed near the SiC surface by implanting ions in the SiC surface in the first step, and the SiC containing the amorphous layer is oxidized in the second step.

* * * * *

UNITED STATES PATENT AND TRADEMARK OFFICE
CERTIFICATE OF CORRECTION

PATENT NO. : 6,214,107 B1　　　　　　　　　　　　　　　　　　　　Page 1 of 1
DATED : April 10, 2001
INVENTOR(S) : Kitabatake It is certified that error appears in the above-identified patent and that said Letters Patent is hereby corrected as shown below:

<u>Title page,</u>
Item [63], "Oct. 23, 1997" should read -- Mar. 17, 1997 --.

Signed and Sealed this

Eighteenth Day of December, 2001

Attest:

JAMES E. ROGAN
Attesting Officer　　　　　　　Director of the United States Patent and Trademark Office